(12) United States Patent
Kim et al.

(10) Patent No.: US 9,899,594 B2
(45) Date of Patent: Feb. 20, 2018

(54) MAGNETIC MEMORY DEVICES

(71) Applicant: SAMSUNG ELECTRONICS CO., LTD., Suwon-si, Gyeonggi-do (KR)

(72) Inventors: Ki-Woong Kim, Hwaseong-si (KR); Ju-Hyun Kim, Hwaseong-si (KR); Yong-Sung Park, Suwon-si (KR); Se-Chung Oh, Yongin-si (KR); Joon-Myoung Lee, Anyang-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/169,775

(22) Filed: Jun. 1, 2016

(65) Prior Publication Data

US 2017/0084822 A1 Mar. 23, 2017

(30) Foreign Application Priority Data

Sep. 23, 2015 (KR) .................. 10-2015-0134265

(51) Int. Cl.
| | |
|---|---|
| H01L 29/94 | (2006.01) |
| H01L 43/10 | (2006.01) |
| H01L 43/08 | (2006.01) |
| H01L 27/22 | (2006.01) |
| H01L 43/12 | (2006.01) |

(52) U.S. Cl.
CPC .......... *H01L 43/10* (2013.01); *H01L 27/224* (2013.01); *H01L 27/228* (2013.01); *H01L 43/08* (2013.01); *H01L 43/12* (2013.01)

(58) Field of Classification Search
None
See application file for complete search history.

(56) References Cited

U.S. PATENT DOCUMENTS

| | | | |
|---|---|---|---|
| 4,749,628 A | 6/1988 | Ahlert et al. |
| 5,051,288 A | 9/1991 | Ahlert et al. |
| 5,066,552 A | 11/1991 | Howard et al. |
| 5,639,563 A | 6/1997 | Ohnuki et al. |
| 5,736,262 A | 4/1998 | Ohkijima et al. |
| 5,900,324 A | 5/1999 | Moroishi et al. |
| 5,981,054 A | 11/1999 | Hikosaka et al. |
| 5,989,728 A | 11/1999 | Coffey et al. |
| 6,111,722 A | 8/2000 | Fukuzawa et al. |
| 6,157,525 A | 12/2000 | Iwasaki et al. |
| 6,477,020 B1 | 11/2002 | Aoshima et al. |
| 6,667,116 B1 | 12/2003 | Uwazumi et al. |

(Continued)

FOREIGN PATENT DOCUMENTS

| | | |
|---|---|---|
| JP | 2002-374017 A | 12/2002 |
| JP | 2011-138924 A | 7/2011 |

(Continued)

*Primary Examiner* — Ali Naraghi
(74) *Attorney, Agent, or Firm* — Lee & Morse, P.C.

(57) ABSTRACT

A magnetic memory device includes a substrate, a circuit device on the substrate, a lower electrode electrically connected to the circuit device, a magnetic tunnel junction structure (MTJ structure) on the lower electrode, and an upper electrode on the MTJ structure. The MTJ structure includes a pinned layer structure including at least one crystalline ferromagnetic layer and at least one amorphous ferromagnetic layer, a free layer, and a tunnel barrier layer between the pinned layer structure and the free layer.

18 Claims, 19 Drawing Sheets

(56) References Cited

U.S. PATENT DOCUMENTS

| | | |
|---|---|---|
| 6,673,475 B2 | 1/2004 | Oikawa et al. |
| 6,696,183 B2 | 2/2004 | Onodera et al. |
| 6,704,177 B2 | 3/2004 | Morinaga et al. |
| 6,716,543 B2 | 4/2004 | Uwazumi et al. |
| 6,893,740 B2 | 5/2005 | Saito |
| 6,903,906 B2 | 6/2005 | Morinaga et al. |
| 6,930,847 B2 | 8/2005 | Kai et al. |
| 7,054,087 B2 | 5/2006 | Kai et al. |
| 7,081,268 B2 | 7/2006 | Chang et al. |
| 7,098,495 B2 | 8/2006 | Sun et al. |
| 7,116,527 B1 | 10/2006 | Fukuzawa et al. |
| 7,132,177 B2 | 11/2006 | Mukai |
| 7,183,013 B2 | 2/2007 | Oikawa et al. |
| 7,206,175 B2 | 4/2007 | Morinaga et al. |
| 7,230,803 B2 | 6/2007 | Morinaga et al. |
| 7,235,314 B2 | 6/2007 | Chen et al. |
| 7,241,631 B2 | 7/2007 | Huai et al. |
| 7,336,454 B2 | 2/2008 | Fukuzawa et al. |
| 7,400,143 B2 | 7/2008 | Hayashi et al. |
| 7,431,999 B2 | 10/2008 | Iwasaki et al. |
| 7,498,805 B2 | 3/2009 | Siegle et al. |
| 7,514,162 B2 | 4/2009 | Berger et al. |
| 7,595,966 B2 | 9/2009 | Watanabe et al. |
| 7,601,445 B2 | 10/2009 | Iwasaki et al. |
| 7,666,531 B2 | 2/2010 | Iwasaki et al. |
| 7,799,446 B2 | 9/2010 | Mukai |
| 7,819,988 B2 | 10/2010 | Cui et al. |
| 8,043,733 B2 | 10/2011 | Lee et al. |
| 8,089,829 B2 | 1/2012 | Akagi et al. |
| 8,105,707 B2 | 1/2012 | Uwazumi et al. |
| 8,208,292 B2 | 6/2012 | Kai et al. |
| 8,270,286 B2 | 9/2012 | Kanbe et al. |
| 8,279,739 B2 | 10/2012 | Kanbe et al. |
| 8,320,232 B1 | 11/2012 | Marinero et al. |
| 8,399,051 B1 | 3/2013 | Hellwig et al. |
| 8,415,035 B2 | 4/2013 | Lee et al. |
| 8,472,147 B2 | 6/2013 | Singleton et al. |
| 8,492,010 B2 | 7/2013 | Hellwig et al. |
| 8,509,039 B1 | 8/2013 | Huang et al. |
| 8,537,505 B2 | 9/2013 | Shiimoto et al. |
| 8,542,569 B2 | 9/2013 | Kanbe et al. |
| 8,576,519 B1 | 11/2013 | Carey et al. |
| 8,582,416 B2 | 11/2013 | Kanbe et al. |
| 8,604,572 B2 | 12/2013 | Wang et al. |
| 8,721,903 B2 | 5/2014 | Bian et al. |
| 8,792,313 B2 | 7/2014 | Niwa et al. |
| 8,830,629 B2 | 9/2014 | Hohlfeld et al. |
| 8,879,315 B2 | 11/2014 | Yamane et al. |
| 8,883,327 B2 | 11/2014 | Hirayama et al. |
| 8,883,328 B2 | 11/2014 | Kuboki |
| 8,941,950 B2 | 1/2015 | Yuan et al. |
| 8,988,828 B2 | 3/2015 | Kanbe et al. |
| 9,007,880 B2 | 4/2015 | Kanbe et al. |
| 9,028,984 B2 | 5/2015 | Sakai et al. |
| 9,218,866 B2 * | 12/2015 | Ranjan ................ G11C 11/5607 |
| 2003/0180576 A1 | 9/2003 | Nakamura et al. |
| 2005/0007819 A1 * | 1/2005 | Fukuzumi .............. B82Y 10/00 365/171 |
| 2006/0017081 A1 * | 1/2006 | Sun ........................ B82Y 25/00 257/295 |
| 2006/0147760 A1 | 7/2006 | Uwazumi et al. |
| 2007/0009654 A1 | 1/2007 | Watanabe et al. |
| 2007/0082231 A1 | 4/2007 | Nakamura et al. |
| 2007/0148789 A1 * | 6/2007 | Bae ........................ B82Y 10/00 438/3 |
| 2008/0050616 A1 | 2/2008 | Lee et al. |
| 2008/0057348 A1 | 3/2008 | Shimizu et al. |
| 2009/0068500 A1 | 3/2009 | Kong et al. |
| 2009/0117409 A1 | 5/2009 | Lee et al. |
| 2009/0197119 A1 | 8/2009 | Kong et al. |
| 2010/0078310 A1 | 4/2010 | Tsunekawa et al. |
| 2012/0063034 A1 | 3/2012 | Hsu et al. |
| 2012/0163069 A1 | 6/2012 | Grollier et al. |
| 2012/0300600 A1 | 11/2012 | Kanbe et al. |
| 2012/0307398 A1 | 12/2012 | Kanbe et al. |
| 2013/0015539 A1 | 1/2013 | Choi |
| 2013/0032910 A1 | 2/2013 | Jung et al. |
| 2013/0208578 A1 | 8/2013 | Kanbe et al. |
| 2014/0236028 A1 | 8/2014 | Yuasa et al. |
| 2014/0308542 A1 | 10/2014 | Zhang et al. |
| 2015/0029830 A1 | 1/2015 | Zhang et al. |
| 2015/0036242 A1 | 2/2015 | Zhang et al. |
| 2015/0085628 A1 | 3/2015 | Niwa et al. |
| 2015/0117166 A1 | 4/2015 | Zhang et al. |
| 2015/0162525 A1 | 6/2015 | Park et al. |

FOREIGN PATENT DOCUMENTS

| | | |
|---|---|---|
| JP | 5166600 B2 | 3/2013 |
| JP | 2015-088520 A | 5/2015 |
| KR | 10-2013-0016823 A | 2/2013 |

* cited by examiner

MAGNETIC MEMORY DEVICES

CROSS-REFERENCE TO RELATED APPLICATION

Korean Patent Application No. 10-2015-0134265, filed on Sep. 23, 2015, in the Korean Intellectual Property Office, and entitled: "Magnetic Memory Devices and Methods of Manufacturing the Same," is incorporated by reference herein in its entirety.

BACKGROUND

1. Field

Embodiments relate to magnetic memory devices and methods of manufacturing the same. Embodiments relate to magnetic memory devices including magnetic layers and methods of manufacturing the same.

2. Description of the Related Art

A magnetic random access memory (MRAM) device is a non-volatile memory device in which data is stored using a resistance change of a magnetic tunnel junction (MTJ) structure. The MRAM device has been widely researched due to a rapid operation and a structural stability thereof.

SUMMARY

Embodiments are directed to a magnetic memory device including a substrate, a circuit device on the substrate, a lower electrode electrically connected to the circuit device, a magnetic tunnel junction structure (MTJ structure) on the lower electrode, and an upper electrode on the MTJ structure. The MTJ structure includes a pinned layer structure including at least one crystalline ferromagnetic layer and at least one amorphous ferromagnetic layer, a free layer, and a tunnel barrier layer between the pinned layer structure and the free layer.

The crystalline ferromagnetic layer may include, or consist essentially of, a ferromagnetic metal or an alloy of ferromagnetic metals, the alloy being substantially devoid of a non-magnetic element. The amorphous ferromagnetic layer may include a ferromagnetic metal alloy doped with a non-magnetic element.

The non-magnetic element included in the ferromagnetic metal alloy of the amorphous ferromagnetic layer may be at least one of boron (B), carbon (C), nitrogen (N), oxygen (O), fluorine (F), chlorine (Cl), sulfur (S), aluminum (Al), tantalum (Ta), and tungsten (W).

The crystalline ferromagnetic layer may include a cobalt-platinum alloy (CoPt) or an iron-platinum alloy (FePt). The amorphous ferromagnetic alloy may include CoPtB or FePtB.

A saturation magnetization (Ms) of the amorphous ferromagnetic layer may be less than that of the crystalline ferromagnetic layer.

The Ms of the amorphous ferromagnetic layer may be in a range from about 150 emu/cc to about 800 emu/cc. The Ms of the crystalline ferromagnetic layer may be in a range from about 1,000 emu/cc to about 2,000 emu/cc.

A surface roughness of the amorphous ferromagnetic layer may be less than that of the crystalline ferromagnetic layer.

The pinned layer structure may further include an anti-ferromagnetic spacer between the crystalline ferromagnetic layer and the amorphous ferromagnetic layer.

The crystalline ferromagnetic layer may have a body-centered cubic (bcc) structure or a face-centered cubic (fcc) structure. The anti-ferromagnetic spacer may have a hexagonal close packing (hcp) structure.

The pinned layer structure may include a lower pinned layer, an anti-ferromagnetic spacer and an upper pinned layer, which are sequentially stacked. The crystalline ferromagnetic layer may be included in each of the lower pinned layer and the upper pinned layer.

The amorphous ferromagnetic layer may be included in at least one of the lower pinned layer and the upper pinned layer.

The amorphous ferromagnetic layer may be included in each of the lower pinned layer and the upper pinned layer. The amorphous ferromagnetic layer in the upper pinned layer may contact a top surface of the anti-ferromagnetic spaced. The amorphous ferromagnetic layer in the lower pinned layer may contact a bottom surface of the anti-ferromagnetic spacer.

The crystalline ferromagnetic layer in the upper pinned layer may contact the free layer. The crystalline ferromagnetic layer in the lower pinned layer may contact the lower electrode.

Embodiments are also directed to a magnetic memory device including a substrate, a circuit device on the substrate, a lower electrode electrically connected to the circuit device, a magnetic tunnel junction structure (MTJ structure) on the lower electrode, and an upper electrode on the MTJ structure. The MTJ structure includes a pinned layer structure including a plurality of pinned layers that have different saturation magnetizations (Ms) and surface roughnesses, a free layer, and a tunnel barrier layer between the pinned layer structure and the free layer.

The pinned layer structure may include a crystalline ferromagnetic layer and an amorphous ferromagnetic layer having an Ms and a surface roughness less than an Ms and surface roughness of the crystalline ferromagnetic layer.

The Ms of the amorphous ferromagnetic layer may be in a range from about 150 emu/cc to about 800 emu/cc. The Ms of the crystalline ferromagnetic layer may be in a range from about 1,000 emu/cc to about 2,000 emu/cc.

The pinned layer structure may include a lower pinned layer, an upper pinned layer and an anti-ferromagnetic spacer separating the lower pinned layer and the upper pinned layer. At least one of the upper pinned layer and the lower pinned layer may include a stack structure of the crystalline ferromagnetic layer and the amorphous ferromagnetic layer.

The amorphous ferromagnetic layer may directly contact the anti-ferromagnetic spacer.

Embodiments are also directed to a magnetic memory device including a plurality of first conductive lines extending in a first direction, a plurality of second conductive lines located over the first conductive lines, the second conductive lines extending in a second direction crossing the first direction, and magnetic tunnel junction structures (MTJ structures) interposed between the first conductive lines and the second conductive lines, each MTJ structure including a pinned layer pattern including at least one crystalline ferromagnetic pattern and at least one amorphous ferromagnetic pattern, a free layer pattern, and a tunnel barrier pattern between the pinned layer pattern and the free layer pattern.

A saturation magnetization (Ms) and a surface roughness of the amorphous ferromagnetic pattern may be less than an Ms and a surface roughness of the crystalline ferromagnetic pattern.

The pinned layer pattern may further include an anti-ferromagnetic spacer between an upper portion and a lower portion of the pinned layer pattern. The amorphous ferromagnetic pattern is included in at least one of the upper portion and the lower portion.

The amorphous ferromagnetic pattern may include a first amorphous ferromagnetic pattern and a second amorphous ferromagnetic pattern located at the upper portion and the lower portion from the anti-ferromagnetic spacer, respectively. The anti-ferromagnetic spacer may be sandwiched between the first amorphous ferromagnetic pattern and the second amorphous ferromagnetic pattern.

The magnetic memory device may further include a selection element between one of the MTJ structures and one of the first conductive lines.

The selection element may include a diode.

The magnetic memory device may further include a lower electrode between one of the MTJ structures and one of the first conductive lines and an upper electrode between one of the MTJ structures and one of the second conductive lines.

Embodiments are also directed to a magnetic memory device including a substrate, a circuit device on the substrate, a lower electrode electrically connected to the circuit device, a magnetic tunnel junction structure (MTJ structure) on the lower electrode, and an upper electrode on the MTJ structure. The MTJ structure includes a pinned layer structure including a lower pinned layer, a spacer, and an upper pinned layer, which are sequentially stacked, each of the lower pinned layer and the upper pinned layer including an amorphous ferromagnetic layer doped with an impurity, a free layer, and a tunnel barrier layer between the pinned layer structure and the free layer.

The impurity may include at least one non-magnetic element selected from boron (B), carbon (C), nitrogen (N), oxygen (O), fluorine (F), chlorine (Cl), sulfur (S), aluminum (Al), tantalum (Ta), and tungsten (W).

Each of the lower pinned layer and the upper pinned layer may include a crystalline ferromagnetic layer. The crystalline ferromagnetic layer may include an alloy including, or consisting essentially of, ferromagnetic metals. The alloy may be substantially devoid of a non-magnetic element The amorphous ferromagnetic layer may serve as a low saturation magnetization layer (low Ms layer). The crystalline ferromagnetic layer may serve as a high saturation magnetization layer (high Ms layer).

The pinned layer structure may have a multi-layered structure of the high Ms layer, the low Ms layer, the spacer, the low Ms layer and the high Ms layer, which are sequentially stacked.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
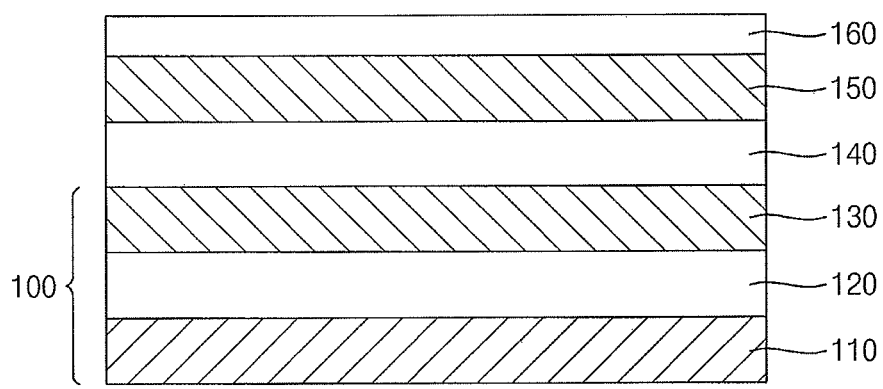
FIGS. 1 and 2 illustrate cross-sectional views of magnetic tunnel junction (MTJ) structures in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "connected to" or "coupled to" another element or layer, it can be directly connected or coupled to the other element or layer, or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items.

Spatially relative terms, such as "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
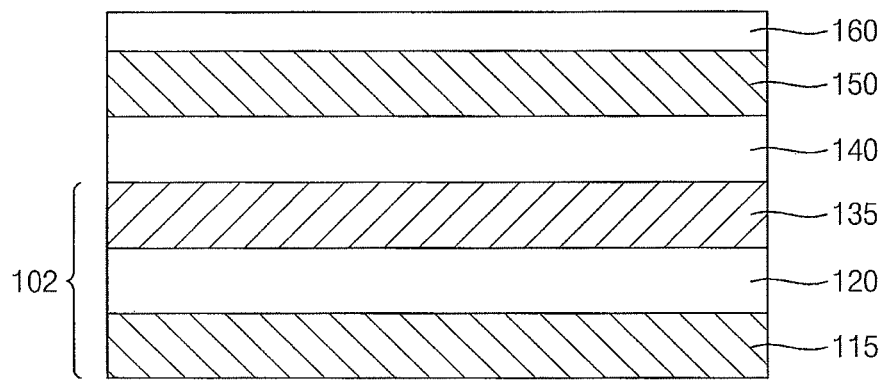

FIGS. 1 and 2 illustrate cross-sectional views of magnetic tunnel junction structures (MTJ structures) in accordance with example embodiments.

Referring to FIG. 1, the MTJ structure may include a pinned layer structure 100, a tunnel barrier layer 140, a free layer 150 and a capping layer 160 which may be sequentially stacked.

The pinned layer structure 100 may include a lower pinned layer 110 and an upper pinned layer 130. A spacer 120 may be interposed between the upper pinned layer 130 and the lower pinned layer 110.

A magnetization direction in each the lower pinned layer 110 and the upper pinned layer 130 may be fixed. In some embodiments, the magnetization directions in the lower pinned layer 110 and the upper pinned layer 130 may be fixed to be opposite to each other.

In example embodiments, the upper pinned layer 130 may include a ferromagnetic metal such as cobalt (Co), iron (Fe), platinum (Pt), manganese (Mn), palladium (Pd), tellurium (Te), chromium (Cr), nickel (Ni), etc., or an alloy thereof. In some embodiments, the upper pinned layer 130 may include a binary alloy or a ternary alloy such as CoPt, FePt, FePd, MnFe, CoCr, CoCrPt, or the like. In some embodiments, the upper pinned layer 130 may include at least one of Co or Fe.

In some embodiments, the alloy included in the upper pinned layer 130 may consist essentially of the ferromagnetic metal. For example, the alloy may be substantially devoid of a non-magnetic element.

The upper pinned layer 130 may have a crystalline structure. For example, the upper pinned layer 130 may have a body-centered cubic (bcc) structure or a face-centered cubic (fcc) structure. In an embodiment, the upper pinned layer 130 may have the bcc structure.

A saturation magnetization (Ms) of the upper pinned layer 130 may be greater than the saturation magnetization of the lower pinned layer 110. In some embodiments, the Ms of the upper pinned layer 130 may be in a range from about 1,000 emu/cc to about 2,000 emu/cc.

A surface roughness of the upper pinned layer 130 may be greater than that of the lower pinned layer 110. As described above, the upper pinned layer 130 may have a crystal structure. In this case, a surface spike may be generated during a crystal growth to cause a relatively high surface roughness.

The lower pinned layer 110 may be spaced apart from the upper pinned layer 130 by the spacer 120.

In example embodiments, the lower pinned layer 110 may include a non-magnetic element in addition to the above-mentioned ferromagnetic metal. For example, the lower pinned layer 110 may include a ferromagnetic alloy in which the non-magnetic element is mixed or doped.

The non-magnetic element may include boron (B), carbon (C), nitrogen (N), oxygen (O), fluorine (F), chlorine (Cl), sulfur (S), aluminum (Al), tantalum (Ta), or tungsten (W). These may be used alone or in a combination thereof.

In some embodiments, the lower pinned layer 110 may include a Co-based metal or alloy, or a Fe-based metal or alloy in which the non-magnetic element is mixed or doped. In some embodiments, the lower pinned layer 110 may include CoPtB, FePtB, manganese oxide (MnO), manganese sulfide (MnS), manganese fluoride ($MnF_2$), iron fluoride ($FeF_2$), iron chloride ($FeCl_2$), iron oxide (FeO), cobalt chloride ($CoCl_2$), cobalt oxide (CoO), nickel chloride ($NiCl_2$), nickel oxide (NiO), etc. These may be used alone or in a combination thereof.

In an embodiment, the lower pinned layer 110 may include a boron-doped Co-based alloy or a boron-doped Fe-based alloy. For example, the lower pinned layer 110 may include CoPtB and FePtB.

In example embodiments, the lower pinned layer 110 may have an amorphous structure. For example, an impurity such as boron may intervene in an alloy structure such that a crystal structure may be transformed into the amorphous structure.

The Ms of the lower pinned layer 110 may be less than that of the upper pinned layer 130. In some embodiments, the Ms of the lower pinned layer 130 may be in a range from about 150 emu/cc to about 800 emu/cc.

The lower pinned layer 110 may have the amorphous structure as described above, and may have the surface roughness less than that of the upper pinned layer 130.

The spacer 120 may include, e.g., a synthetic anti-ferromagnetic (SAF) material. The spacer 120 may serve as an anti-ferromagnetic coupling spacer. The magnetization directions of the upper pinned layer 130 and the lower pinned layer 110 may be anti-parallel to each other.

For example, the spacer 120 may include at least one of ruthenium (Ru), iridium (Ir), palladium (Pd), osmium (Os), and rhodium (Rh).

In some embodiments, the spacer 120 may have a crystal structure. For example, the spacer 120 may have a hexagonal close packing (hcp) structure.

The tunnel barrier layer 140 may include an insulative metal oxide. In some embodiments, the tunnel barrier layer 140 may include a magnesium oxide (MgOx) or an aluminum oxide (AlOx). An insulation tunnel barrier generating quantum mechanical tunneling may be formed from the tunnel barrier layer 140 between the free layer 150 and the pinned layer structure 100, or spin polarization may be generated by the tunnel barrier layer 140.

A magnetization direction in the free layer 150 may be variable. The free layer 150 may include a ferromagnetic material such as Fe, Co, Ni, Cr, Pt, or the like. For example, the free layer 150 may include a metal or an alloy containing at least one of Fe, Ni or Co.

In some embodiments, the free layer 150 may have a crystal structure. For example, the free layer 150 may have a bcc structure or an fcc structure. In an embodiment, the free layer 150 may have a bcc structure that is substantially the same as that of the upper pinned layer 130.

The capping layer 160 may be further disposed on the free layer 150. In some embodiments, the capping layer 160 may include a metal oxide such as a magnesium oxide or an aluminum oxide that is substantially the same as, or similar to, that of the tunnel barrier layer 140. In some embodiments, the capping layer 160 may include a nitride of a metal such as titanium (Ti), tantalum (Ta) or tungsten (W).

According to example embodiments as described above, the pinned layer structure 100 may include the upper pinned layer 130 having the crystal structure and having the relatively high Ms and/or surface roughness, and the lower pinned layer 110 having the amorphous structure and having the relatively low MS and/or surface roughness.

The lower pinned layer 110 may have the reduced Ms due to the amorphous structure thereof, such that an exchange field (Hex) of the MTJ structure may be increased. Thus, a conversion margin (e.g., a write/read conversion margin) of a magnetization direction between the free layer 150 and the pinned layer structure 100 may be increased such that an operational reliability in the MTJ structure may be improved.

The lower pinned layer 110 may have the low surface roughness such that defects, e.g., a diffusion of the anti-ferromagnetic material caused by a damage of an interface with the spacer 120, may be prevented. Thus, the Hex of the MTJ structure may be increased while improving and/or maintaining tunneling magnetoresistance (TMR) properties of the MTJ structure.

The upper pinned layer 130 may include the ferromagnetic material of the crystal structure. A desired amount of a magnetic vector for generating a spin polarization with the free layer 150 may be maintained.

A property of the spin polarization with the free layer 150 may be improved, and the Hex of the MTJ structure may be increased such that an overall operational reliability in the MTJ structure may be improved.

Referring to FIG. 2, a pinned layer structure 102 of an MTJ structure may include an upper pinned layer 135 and a lower pinned layer 115 facing each other with respect to the spacer 120.

According to example embodiment illustrated in FIG. 2, the pinned layer structure 102 may have an arrangement substantially reverse to that of the pinned layer structure 100 illustrated in FIG. 1.

For example, the lower pinned layer 115 may include a Co-based or Fe-based ferromagnetic crystalline alloy. The lower pinned layer 115 may have a relatively high Ms and/or a relatively high surface roughness.

The upper pinned layer 135 may include, e.g., a Co-based or Fe-based alloy doped with an impurity such as boron. The upper pinned layer 135 may have an amorphous structure, and may have a relatively low Ms and/or a relatively low surface roughness.

As described with reference to FIGS. 1 and 2, the pinned layer structure of the MTJ structure may include a crystalline high Ms pinned layer and an amorphous low Ms pinned layer. Thus, the MTJ structure having a high Hex and spin polarization efficiency may be obtained without degrading the TMR properties thereof.

Figure 3:
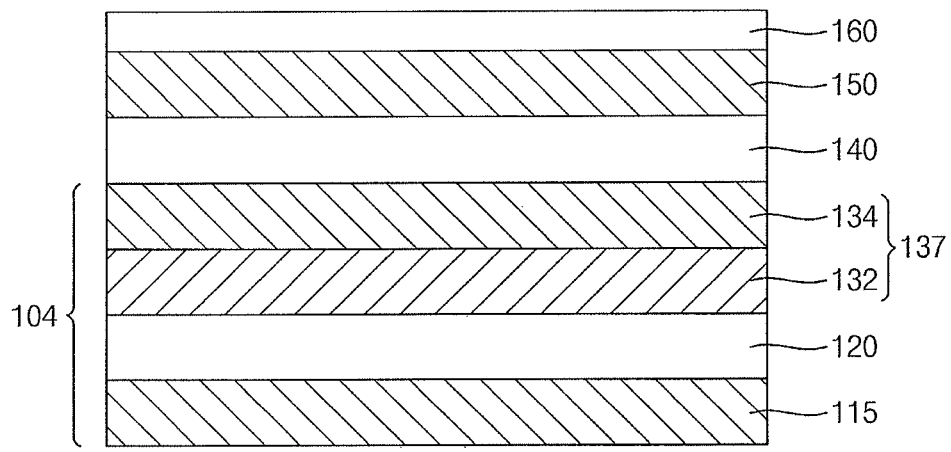
FIGS. 3 and 4 illustrate cross-sectional views of MTJ structures in accordance with example embodiments.
Figure 4:
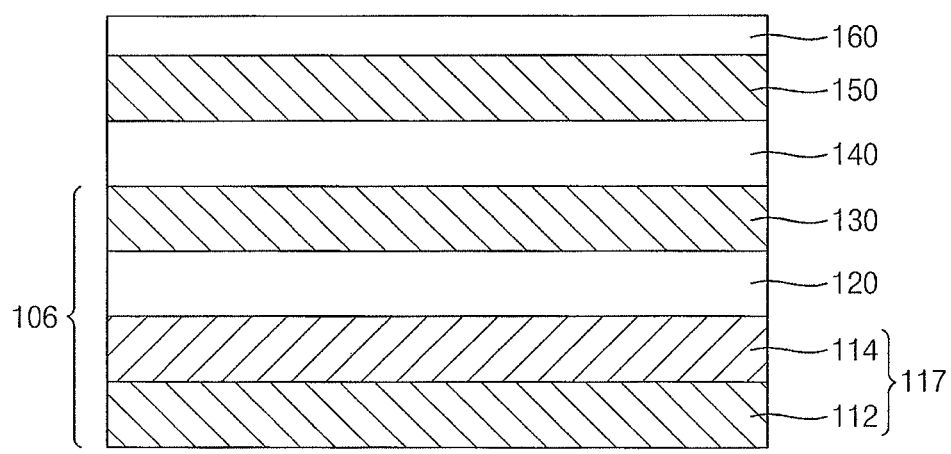

FIGS. 3 and 4 illustrate cross-sectional views of MTJ structures in accordance with example embodiments.

The MTJ structures of FIGS. 3 and 4 may have elements and/or constructions substantially the same as or similar to those of the MTJ structures illustrated in FIGS. 1 and 2 except for a layer construction of the pinned layer structures. Thus detailed descriptions of repeated elements and/or structures are not repeated herein, and like reference numerals are used to designate like elements.

Referring to FIG. 3, a pinned layer structure 104 may include a lower pinned layer 115, a spacer 120 and an upper pinned layer 137.

The lower pinned layer 115 may include a material substantially the same as or similar to that of the lower pinned layer illustrated in FIG. 2. As described above, the lower pinned layer 115 may include, e.g., a Co-based or Fe-based ferromagnetic crystalline alloy. Accordingly, the lower pinned layer 115 may have a relatively high Ms and/or a relatively high surface roughness.

In example embodiments, the upper pinned layer 137 may include a first upper pinned layer 132 and a second upper pinned layer 134.

The first upper pinned layer 132 may contact a top surface of the spacer 120. The first upper pinned layer 132 may include a material substantially the same as or similar to that of the lower pinned layer 110 illustrated in FIG. 1. In example embodiments, the first upper pinned layer 132 may include, e.g., a Co-based or Fe-based alloy doped with an impurity such as boron. Accordingly, the first upper pinned layer 132 may have an amorphous structure, and may have a relatively low Ms and/or a relatively low surface roughness.

The second upper pinned layer 134 may be stacked on the first upper pinned layer 132, and may contact a tunnel barrier layer 140. In example embodiments, the second upper pinned layer 134 may include a material substantially the same as or similar to that of the lower pinned layer 115. For example, the second upper pinned layer 134 may include a Co-based or Fe-based ferromagnetic crystalline alloy. Accordingly, the second upper pinned layer 134 may have a relatively high Ms and/or a relatively high surface roughness.

According to example embodiment illustrated in FIG. 3, the pinned layer structure 104 of the MTJ structure may include a high Ms/anti-ferromagnetic/low Ms/high Ms-stack structure, or a crystalline ferromagnetic/anti-ferromagnetic/amorphous ferromagnetic/crystalline ferromagnetic-stack structure. The pinned layers having the crystalline ferromagnetic structure may be disposed on and under the spacer 120 such that a desired magnitude of a magnetic vector may be achieved. Further, the pinned layer having the amorphous structure and the low Ms may be included in the upper pinned layer 137 to contact the spacer 120. Thus, a Hex of the MTJ structure may be increased while preventing or reducing the likelihood of damage at an interface with the spacer 120.

In some embodiments, an arrangement of the first and second upper pinned layers 132 and 134 may be reversed. In this case, the spacer 120 may be interposed between the pinned layers having the crystalline ferromagnetic structure, and the pinned layer having the amorphous structure and the low Ms may be disposed under the tunnel barrier layer 140.

Referring to FIG. 4, a pinned layer structure 106 of the MTJ structure may include a lower pinned layer 117, a spacer 120 and an upper pinned layer 130.

The upper pinned layer 130 may include, e.g., a material substantially the same as or similar to that of the upper pinned layer illustrated in FIG. 1 and described above. For example, the upper pinned layer 130 may include, e.g., a Co-based or Fe-based ferromagnetic crystalline alloy. Accordingly, the upper pinned layer 130 may have a relatively high Ms and/or a relatively high surface roughness.

The lower pinned layer 117 may include a first lower pinned layer 112 and a second lower pinned layer 114.

The first lower pinned layer 112 may include a material substantially the same as or similar to that of the upper pinned layer 130. For example, the first lower pinned layer 112 may include a Co-based or Fe-based ferromagnetic crystalline alloy. Accordingly, the first lower pinned layer 112 may have a relatively high Ms and/or a relatively high surface roughness.

The second lower pinned layer 114 may be stacked on the first lower pinned layer 112, and may contact a bottom surface of the spacer 120. The second lower pinned layer 114 may include a material substantially the same as or similar to that of the lower pinned layer 110 illustrated in FIG. 1. For example, the second lower pinned layer 114 may include, e.g., a Co-based or Fe-based alloy doped with an impurity such as boron. Accordingly, the second lower pinned layer 114 may have an amorphous structure, and may have a relatively low Ms and/or a relatively low surface roughness.

According to the example embodiment illustrated in FIG. 4, the pinned layer structure 106 of the MTJ structure may include a high Ms/low Ms/anti-ferromagnetic/high Ms-stack structure, or a crystalline ferromagnetic/amorphous ferromagnetic/anti-ferromagnetic/crystalline ferromagnetic-stack structure.

In some embodiments, an arrangement of the first and second lower pinned layers 112 and 114 may be reversed. In this case, the pinned layer having the amorphous structure and the low Ms may be provided as a base layer, and a crystalline ferromagnetic/the spacer 120/crystalline ferromagnetic-stack structure may be disposed on the base layer.

According to example embodiments described with reference to FIGS. 3 and 4, one of the upper pinned layer or the lower pinned layer included in the pinned layer structure may include an amorphous ferromagnetic/crystalline ferromagnetic-stack structure. The pinned layers having the crystalline ferromagnetic structure may be disposed on and under the spacer 120 such that the desired magnitude of the magnetic vector may be achieved. Further, the pinned layer having the amorphous structure and the low Ms may be included in the pinned layer structure so that the Hex of the MTJ structure may be increased.

Figure 5:
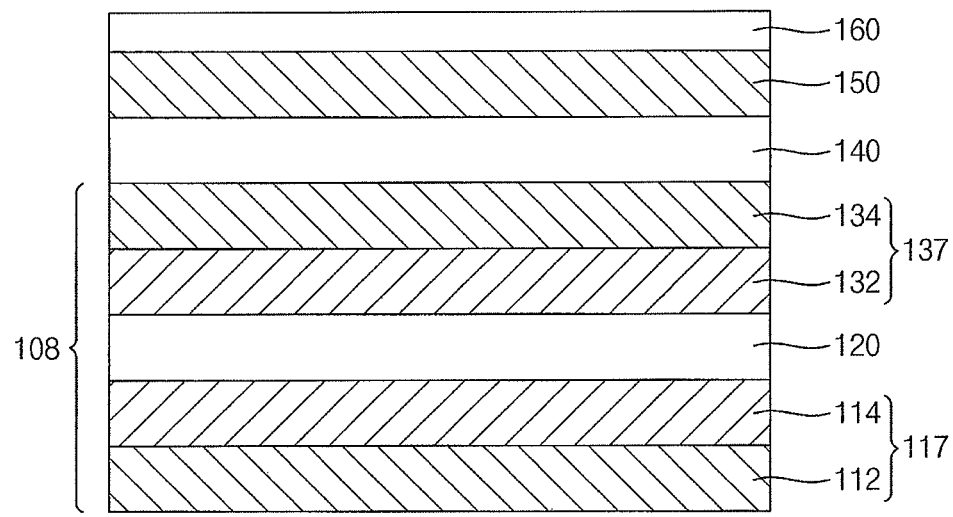
FIG. 5 illustrates a cross-sectional view of an MTJ structure in accordance with example embodiments.

FIG. 5 illustrates a cross-sectional view of an MTJ structure in accordance with example embodiments.

Referring to FIG. 5, a pinned layer structure 108 of the MTJ structure may include a combination of the upper pinned layer 137 illustrated in FIG. 3 and the lower pinned layer 117 illustrated in FIG. 4.

In example embodiments, the pinned layer structure 108 may include the lower pinned layer 117, a spacer 120 and the upper pinned layer 137, which may be sequentially stacked. The lower pinned layer 117 may include a first lower pinned layer 112 and a second lower pinned layer 114, and the upper pinned layer 137 may include a first upper pinned layer 132 and a second upper pinned layer 134.

The first lower pinned layer 112 and the second upper pinned layer 134 may include a material substantially the same as or similar to that of the upper pinned layer 130 illustrated in FIG. 1. For example, the first lower pinned layer 112 and the second upper pinned layer 134 may include a Co-based or Fe-based ferromagnetic crystalline alloy. Accordingly, the first lower pinned layer 112 and the second upper pinned layer 134 may have a relatively high Ms and/or a relatively high surface roughness.

The second lower pinned layer 114 and the first upper pinned layer 132 may include a material substantially the same as or similar to that of the lower pinned layer 110 illustrated in FIG. 1. For example, the second lower pinned layer 114 and the first upper pinned layer 132 may include, e.g., a Co-based or Fe-based alloy doped with an impurity such as boron, and may have an amorphous structure and a relatively low Ms and/or a relatively low surface roughness.

According to example embodiments illustrated in FIG. 5, the pinned layer structure 108 may include a high Ms/low Ms/anti-ferromagnetic/low Ms/high Ms-stack structure, or a crystalline ferromagnetic/amorphous ferromagnetic/anti-ferromagnetic/amorphous ferromagnetic/crystalline ferromagnetic-stack structure.

Thus, uppermost and lowermost layers of the pinned layer structure 108 may include pinned layers having a crystalline structure and/or a high Ms, such that a desired magnitude of a magnetization vector and a spin polarization efficiency may be achieved in the MTJ structure. The spacer 120 may be sandwiched between the pinned layers having the amorphous structure and/or a low Ms. Thus, damage to the spacer 120 that could be caused by spikes from a crystal growth may be avoided, and an increase of Hex may be facilitated.

Figure 6:
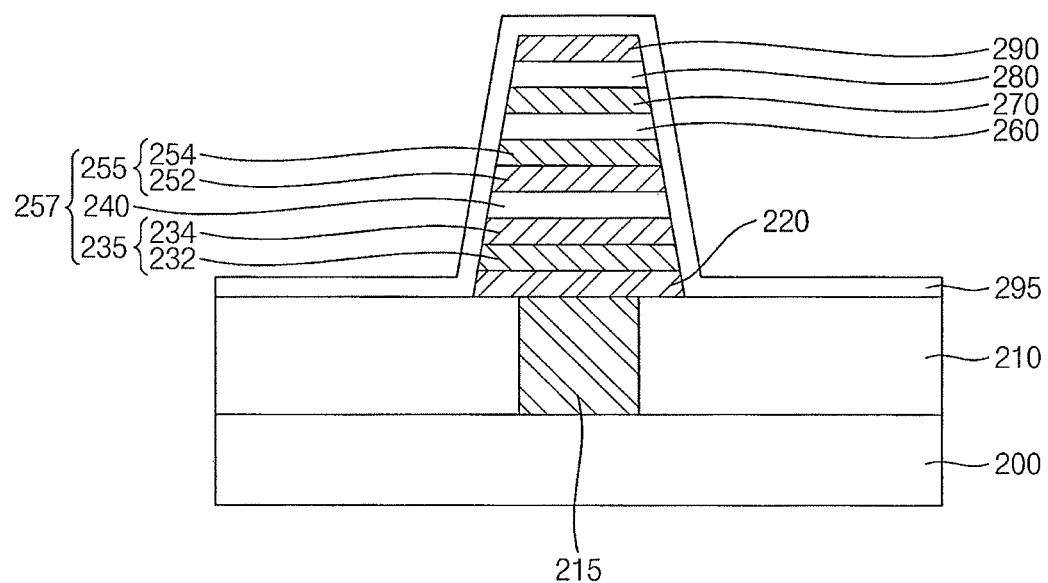
FIG. 6 illustrates a cross-sectional view of a magnetic memory device in accordance with example embodiments.

FIG. 6 illustrates a cross-sectional view of a magnetic memory device in accordance with example embodiments.

Referring to FIG. 6, the magnetic memory device may include a contact plug 215 formed on a substrate 200, and a magnetic memory element electrically connected to the contact plug 215.

The substrate 200 may include silicon, germanium, silicon-germanium, or a group III-V compound such as GaP, GaAs, GaSb, etc. In some embodiments, the substrate 200 may include a silicon-on-insulator (SOI) substrate, or a germanium-on-insulator (GOI) substrate.

A circuit device including a word line, a transistor, a diode, a source/drain layer, a contact, a wiring, etc., may be formed on the substrate 200. In some embodiments, a lower insulation layer covering the circuit device may be formed on the substrate 200.

An insulating interlayer 210 may be formed on the substrate 200, and the contact plug 215 may extend through the insulating interlayer 210.

For example, the insulating interlayer 210 may be formed on the lower insulation layer. The insulating interlayer 210 may be formed of silicon oxide provided by, for example, a plasma enhanced oxide (PEOX), tetraethyl orthosilicate (TEOS) or a flowable oxide (FOX), etc.

The contact plug 215 may be formed in the insulating interlayer 210. The contact plug 215 may be electrically connected to at least a portion of the circuit device. The contact plug 215 may include a metal such as tungsten (W), titanium (Ti), tantalum (Ta), etc., a nitride of the metal, or doped polysilicon.

The magnetic memory element may be disposed on the contact plug 215. The magnetic memory element may include a lower electrode 220, an MTJ structure and an upper electrode 290 sequentially stacked from a top surface of the contact plug 215.

The lower electrode 220 may be disposed on, e.g., in direct contact with, the contact plug 215. In some embodiments, the lower electrode 220 may have a bottom surface that is wider than the top surface of the contact plug 215. The lower electrode 220 may substantially cover the entire top surface of the contact plug 215, and may also cover a portion of the top surface of the insulating interlayer 210.

The lower electrode 220 may include a metal such as Ti, Ta, W, etc., or a nitride of the metal.

The MTJ structure may be disposed on the lower electrode 220, e.g., a lower layer of the MTJ structure may be in direct contact with the lower electrode 220. The MTJ structure may include a pinned layer structure 257, a tunnel barrier pattern 260, and a free layer pattern 270 sequentially stacked from the lower electrode 220. A capping pattern 280 may be further formed on the free layer pattern 270.

The MTJ structure may have a construction substantially the same as or similar to that of the MTJ structure illustrated in FIG. 5.

In example embodiments, the pinned layer structure 257 in the MTJ structure may include a lower pinned layer pattern 235, a spacer 240, and an upper pinned layer pattern 255 sequentially stacked from the lower electrode 220. The lower pinned layer pattern 235 may include a first lower pinned layer pattern 232 and a second lower pinned layer pattern 234, and the upper pinned layer pattern 255 may include a first upper pinned layer pattern 252 and a second upper pinned layer pattern 254.

The first lower pinned layer pattern 232 and the second upper pinned layer pattern 254 may include a material substantially the same as or similar to that included in the first lower pinned layer 112 and the second upper pinned layer 134 illustrated in FIG. 5 and described above. For example, the first lower pinned layer pattern 232 and the second upper pinned layer pattern 254 may include a Co-based or Fe-based ferromagnetic crystalline alloy, and may have a relatively high Ms and/or a relatively high surface roughness.

The second lower pinned layer pattern 234 and the first upper pinned layer pattern 252 may include a material substantially the same as or similar to that included in the second lower pinned layer 114 and the first upper pinned layer 132 illustrated in FIG. 5 and described above. For example, the second lower pinned layer pattern 234 and the first upper pinned layer pattern 252 may include a Co-based or Fe-based alloy doped with an impurity such as boron. The second lower pinned layer pattern 234 and the first upper pinned layer pattern 252 may have an amorphous structure, and may have a relatively low Ms and/or a relatively low surface roughness.

The tunnel barrier pattern 260, the free layer pattern 270, and the capping pattern 280 may be sequentially stacked on the pinned layer structure 257, and may include materials substantially the same as or similar to those of the tunnel barrier layer 140, the free layer 150 and the capping layer 160, respectively described with reference to FIGS. 1 to 5.

The upper electrode 290 may include a metal or a metal nitride substantially the same as or similar to the lower electrode 220.

The upper electrode 290 may serve as an etching mask for forming the MTJ structure and the lower electrode 220. In some embodiments, the MTJ structure and the lower electrode 220 may be formed by a dry etching process utilizing the upper electrode 290. A sidewall of the MTJ structure may be tapered due to properties of the dry etching process.

In some embodiments, the upper electrode 290 may have a sufficient thickness in consideration of a thickness of the pinned layer structure 257 including a plurality of layers.

In some embodiments, a passivation layer 295 covering a surface of the magnetic memory element may be further formed. The passivation layer 295 may be formed conformally along the top surface of the insulating interlayer 210, and along a sidewall and a top surface of the magnetic memory element. The passivation layer 295 may include, for example, silicon nitride or silicon oxynitride. The passivation layer 295 may serve as a barrier for blocking a diffusion of materials (e.g., magnetic materials) included in the MTJ structure.

FIG. 6 illustrates that the MTJ structure includes the construction substantially the same as that of the MTJ structure illustrated in FIG. 5. It is to be understood that in some embodiments, the MTJ structure may have a construction substantially the same as or similar to that described with reference to any one of FIGS. 1 to 4.

According to example embodiments as described above, the magnetic memory device may include at least one crystalline (or high Ms) pinned layer and at least one amorphous (or low Ms) pinned layer in the pinned layer structure 257 of the MTJ structure. Thus, a Hex may be increased without degrading TMR properties while achieving a desired magnitude of a magnetic vector and/or a spin polarization property. A conversion margin of a magnetization direction may be increased, and an operational reliability of the magnetic memory device may be improved.

Figure 7:
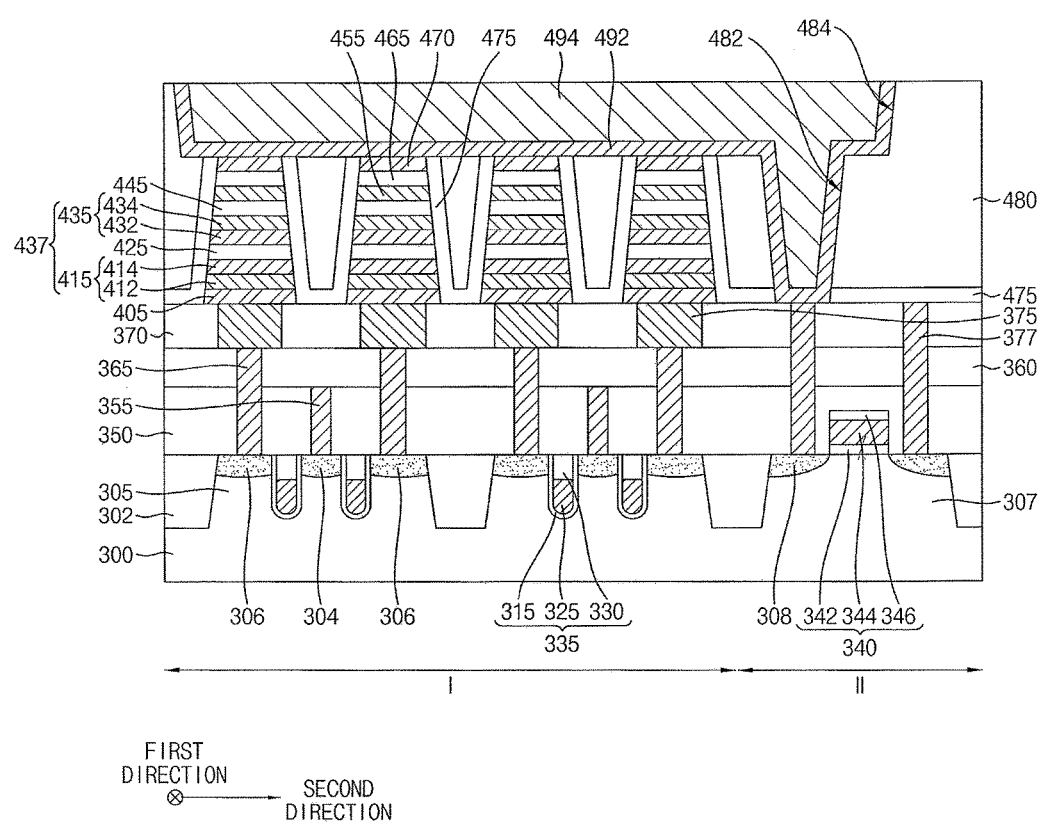
FIG. 7 illustrates a cross-sectional view of a magnetic memory device in accordance with example embodiments.

FIG. 7 illustrates a cross-sectional view of a magnetic memory device in accordance with example embodiments. In FIG. 7, two directions substantially parallel to a top surface of a substrate 300 and orthogonal to each other are defined as a first direction and a second direction. The definitions of the directions may be also applied in FIGS. 8 to 18.

Referring to FIG. 7, the magnetic memory device may include a transistor structure, a wiring structure, and a magnetic memory element. The magnetic memory element may be electrically connected to the transistor structure and the wiring structure on the substrate 300. A conductive line electrically connected to the magnetic memory element may be disposed at an upper portion of the magnetic memory device. For example, the transistor structure the wiring structure, the magnetic memory element and the conductive line may be sequentially formed.

The substrate 300 may include silicon, germanium, silicon-germanium, or a group III-V compound such as GaP, GaAs, GaSb, etc. In some embodiments, the substrate 300 may include an SOI substrate, or a GOI substrate.

The magnetic memory device or the substrate 300 may be divided into a first region I and a second region II. In example embodiments, the first region I may correspond to a cell region in which the magnetic memory elements may be formed. The second region II may correspond to a peripheral circuit region or a logic region.

An isolation layer 302 may be formed at upper portions of the substrate 300 to define active patterns 305 and 307. For example, a first active pattern 305 and a second active pattern 307 may be formed at the first region I and the second region II, respectively.

In some embodiments, the first active pattern 305 may have an island shape in a plan view. A plurality of the first active patterns 305 may be arranged along the first and second directions in the first region I. The second active pattern 307 may extend in, e.g., the first direction in the second region II.

For example, a first gate structure 335 may be formed on the substrate 300 at the first region I. In some embodiments, the first gate structure 335 may be buried in the first active pattern 305. The first gate structure 335 may include, for example, a first gate insulation pattern 315, a first gate electrode 325, and a first gate mask 330 sequentially stacked in a gate trench formed in the first active pattern 305.

In some embodiments, the first gate structure 335 may extend through the isolation layer 302 and a plurality of the first active patterns 305 in the first direction. In some embodiments, two of the first gate structures 335 may be buried in one of the first active patterns 305.

First and second impurity regions 304 and 306 may be formed at upper portions of the first active pattern 305 adjacent to the first gate structure 335. The first impurity region 304 may be formed at an upper portion of the first active pattern 305 between the two first gate structures 335.

The second impurity region 306 may be formed at a peripheral portion of the first active pattern 305. For example, two second impurity regions 306 may be formed per each first active pattern 305, and each second impurity region 306 may face the first impurity region 304 with respect to the first gate structure 335.

For example, a buried cell array transistor (BCAT) structure may be defined by the first gate structure 335, and the first and second impurity regions 304 and 306.

In some embodiments, the first gate electrode 325 may serve as a word line of the magnetic memory device. The first impurity region 304 and the second impurity region 306 may serve as a source region and a drain region, respectively.

A second gate structure 340 may be disposed on a top surface of the second active pattern 307. The second gate structure 340 may include, e.g., a second gate insulation pattern 342, a second gate electrode 344 and a second gate mask 346 sequentially stacked on the top surface of the second active pattern 307.

A third impurity region 308 may be formed at an upper portion of the second active pattern 307 adjacent to the second gate structure 340. A peripheral circuit transistor or a logic transistor may be defined by the second gate structure 340 and the third impurity region 308 in the second region II.

The first gate insulation patterns 315 and 342 may include, for example, silicon oxide or a metal oxide having a high dielectric constant (high-k). The first and second gate electrodes 325 and 344 may include a metal, a metal nitride, a metal silicide and/or doped polysilicon. The first and second gate masks 330 and 346 may include silicon nitride.

FIG. 7 illustrates that the BCAT structure is formed in the first region I, and a planar-type transistor is formed in the second region II. In some implementations, the transistor in the second region II may also have the BCAT structure, or the transistor in the first region I may be a planar-type.

The wiring structure may be disposed on the transistor structure formed on the substrate 300. The wiring structure may include lower wirings electrically connected to the transistor structure. The lower wirings may include a conductive pattern 355, contacts 365 and 377, and pads 375.

A first insulating interlayer 350 may be formed on the isolation layer 302 and the active patterns 305 and 307 and may cover the transistor structures formed in the first and second regions I and II.

The conductive pattern 355 may extend through the first insulating interlayer 350 to be electrically connected to the first impurity region 304. For example, the conductive pattern 355 may extend in the first direction, and may be electrically connected to a plurality of the first impurity regions 304. In this case, the conductive pattern 355 may serve as a source line of the magnetic memory device.

In some embodiments, conductive pattern 355 may serve as a contact electrically connected to each first impurity region 304 in a corresponding relation thereof. A source line extending in the first direction and electrically connected to a plurality of the conductive patterns 355 may be disposed on the first insulating interlayer 350.

A second insulating interlayer 360 may be formed on the first insulating interlayer 350 to cover the conductive pattern 355. A first contact 365 may extend through the second and first insulating interlayers 360 and 350 to be electrically connected to the second impurity region 306. For example, a first contact 365 may be connected to each second impurity region 306, for example, in a corresponding relation thereof.

The third insulating interlayer 370 may be formed on the second insulating interlayer 360 to cover the first contacts 365.

The pad 375 may be formed in the third insulating interlayer 370 to be electrically connected to the first contact 365. A second contact 377 may extend through the third to first insulating interlayers 370, 360, and 350 in the second region II to be electrically connected to the third impurity region 308.

In some embodiments, the pad 375 may be individually provided on each first contact 365. In some embodiments, the pad 375 may extend in, e.g., the first direction to be electrically connected to a plurality of the first contacts 365, for example two or more first contacts 365.

The first to third insulating interlayers 350, 360 and 370 may include a silicon oxide-based material such as TEOS, PEOX, FOX, or the like. The conductive pattern 355, the contacts 365 and 377, and the pad 375 may include a metal such as Ti, Ta or W, and/or a nitride of the metal. The magnetic memory elements may be disposed on the third insulating interlayer 370 and the pads 375.

The magnetic memory element may have elements and/or structures substantially the same as or similar to those illustrated in, e.g., FIG. 6.

In some embodiments, the magnetic memory element may include a lower electrode 405, an MTJ structure and an upper electrode 470 sequentially stacked from a top surface of the pad 375. The MTJ structure may include a pinned layer structure 437, a tunnel barrier pattern 445, and a free layer pattern 455 sequentially stacked from the lower electrode 405, and may further include a capping pattern 465 on the free layer pattern 455.

As described with reference to FIG. 5 or FIG. 6, the pinned layer structure may include a lower pinned layer pattern 415, a spacer 425 and an upper pinned layer pattern 435. The lower pinned layer pattern 415 may include a first lower pinned layer pattern 412 and a second lower pinned layer pattern 414. The upper pinned layer pattern 435 may include a first upper pinned layer pattern 432 and a second upper pinned layer pattern 434.

The first lower pinned layer pattern 412 and the second upper pinned layer pattern 434 may include a material substantially the same as or similar to that of the first lower pinned layer 112 and the second upper pinned layer 134 illustrated in FIG. 5 and described above. For example, the first lower pinned layer pattern 412 and the second upper pinned layer pattern 434 may include a Co-based or Fe-based ferromagnetic crystalline alloy and may have a relatively high Ms and/or a relatively high surface roughness.

The second lower pinned layer pattern 414 and the first upper pinned layer pattern 432 may include a material substantially the same as or similar to that of the second lower pinned layer 114 and the first upper pinned layer 132 illustrated in FIG. 5 and described above. For example, the second lower pinned layer pattern 414 and the first upper pinned layer pattern 432 may include a Co-based or Fe-based alloy doped with an impurity such as boron and may have an amorphous structure. The second lower pinned layer pattern 414 and the first upper pinned layer pattern 432 may have a relatively low Ms and/or a relatively low surface roughness.

FIG. 7 illustrates that the MTJ structure includes a construction substantially the same as that of the MTJ structure illustrated in FIG. 6 or FIG. 5. It is to be understood that, in some embodiments, the MTJ structure may have a construction substantially the same as or similar to that described with reference to any one of FIGS. 1 to 4.

A passivation layer 475 may be formed on the third insulating interlayer 370 and sidewalls of the magnetic memory elements. The passivation layer 475 may include, e.g., silicon nitride or silicon oxynitride.

An upper insulation layer 480 covering the magnetic memory elements may be formed on the passivation layer 475. A conductive line electrically connected to the magnetic memory elements may be formed in the upper insulation layer 480.

For example, an opening including a trench 484 and a via hole 482 may be formed in the upper insulation layer 480. A barrier pattern 492 may be formed along an inner wall of the opening, and a metal filling pattern 494 may be formed on the barrier pattern 492 to fill a remaining portion of the opening. The conductive line including the barrier pattern 492 and the metal filling pattern 494 may be formed.

The barrier pattern 492 may include a metal such as Ti, Ta or ruthenium (Ru), or a nitride of the metal. The metal filling pattern 494 may include copper (Cu) or W.

The conductive line may extend in, e.g., the second direction and may serve as a bit line electrically connected to a plurality of the magnetic memory elements. The conductive line may be also electrically connected to the second contact 377 through a via hole 482. Thus, an electrical signal may be transferred from the peripheral circuit transistor or the logic transistor to the magnetic memory elements.

FIGS. 8 to 18 illustrate cross-sectional views of stages in a method of manufacturing a magnetic memory device in accordance with example embodiments.

Figure 8:
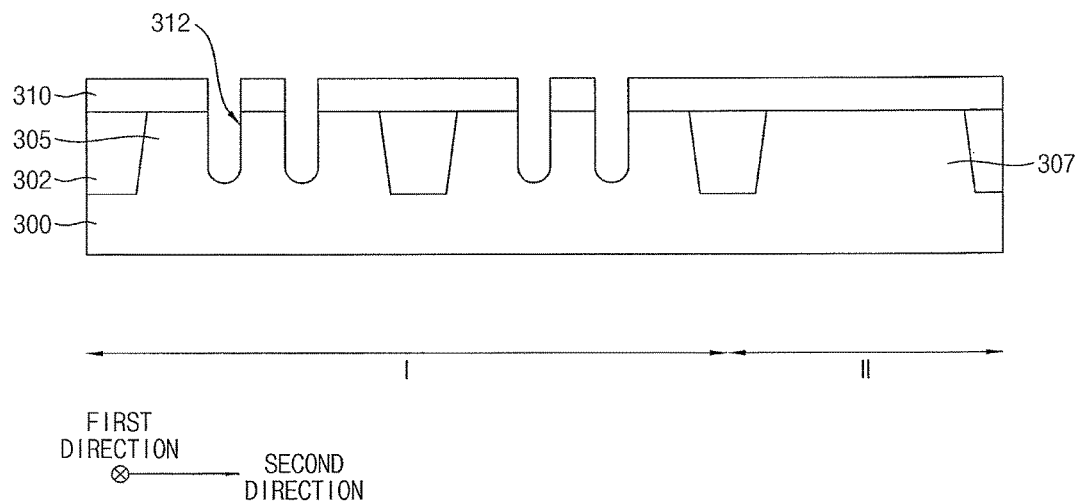
FIGS. 8 to 18 illustrate cross-sectional views of stages in a method of manufacturing a magnetic memory device in accordance with example embodiments.

Referring to FIG. 8, first and second active patterns 305 and 307 may be formed from a substrate 300, and gate trenches 312 may be formed at an upper portion of the first active pattern 305.

The substrate 300 or the magnetic memory device may include a first region I and a second region II. The first region I and the second region II may correspond to a cell region and a peripheral circuit region, respectively.

In example embodiments, the first and second active patterns 305 and 307 may be formed by a shallow trench isolation (STI) process. For example, an upper portion of the substrate 300 may be etched to form an isolation trench, and an insulation layer sufficiently filling the isolation trench may be formed. An upper portion of the insulation layer may be planarized by a chemical mechanical polish (CMP) process to form an isolation layer 302 in the isolation trench.

The upper portion of the substrate 300 may be defined by the isolation layer 302 such that the first active pattern 305 and the second active pattern 307 are formed.

The first active patterns 305 may be formed in the first region I, and may have an island shape buried in the isolation layer 302. The second active pattern 307 may have a plate shape extending in the first direction in the second region II.

A mask pattern 310 partially exposing top surfaces of the first active patterns 305 may be formed on the isolation layer 302. Upper portions of the first active pattern 305 may be etched using the mask pattern 310 to form the gate trenches 312.

In some embodiments, two gate trenches 312 may be formed at one first active pattern 305. Each gate trench 312 may extend through an upper portion of the isolation layer 302 and upper portions of a plurality of the first active patterns 305 in the first direction.

The mask pattern 310 may be formed of, e.g., a silicon nitride-based material, a photoresist material or a spin-on hardmask (SOH) material.

Figure 9:
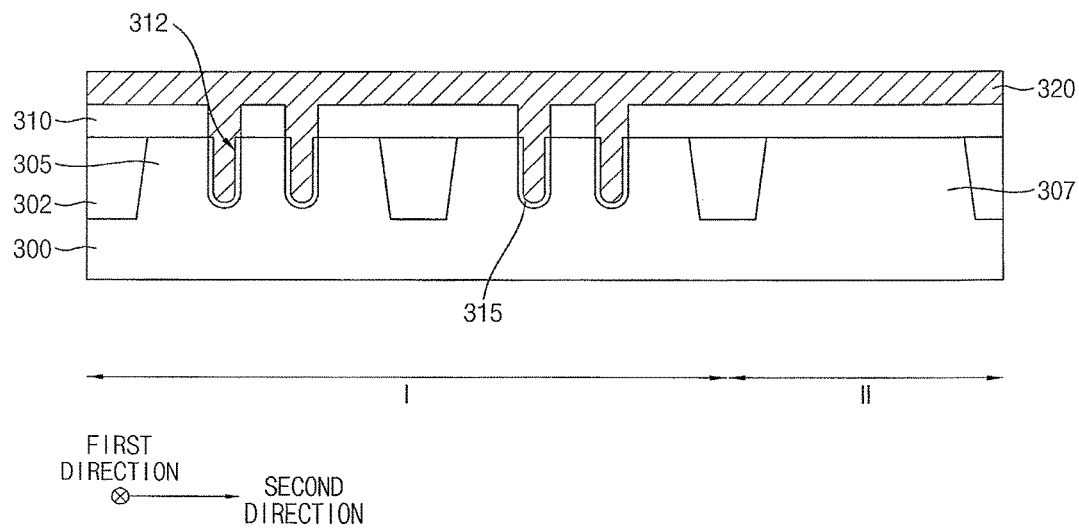

Referring to FIG. 9, a first gate insulation pattern 315 may be formed on an inner wall of the gate trench 312. A first gate electrode layer 320 filling the gate trenches 312 may be formed on the first gate insulation pattern 315 and the mask pattern 310.

In some embodiments, the first gate insulation pattern 315 may be formed by performing a thermal oxidation process or a radical oxidation process on a surface of the substrate 300 exposed by the gate trench 312. In some embodiments, a first gate insulation layer may be formed by depositing silicon oxide or a metal oxide through, e.g., a CVD process on a surface of the mask pattern 310 and the inner wall of the gate trench 312. An upper portion of the first gate insulation layer may be removed to form the first gate insulation pattern 315. For example, the first gate insulation pattern 315 may be conform to and cover a surface of the gate trench 312

The first gate electrode layer 320 may be formed of a metal such as Ti, Ta or W, a metal nitride and/or doped polysilicon by, e.g., an atomic layer deposition (ALD) process or a physical vapor deposition (PVD) process. For example, the first gate electrode layer 320 may fill the gate trenches 312 having the first gate insulation pattern 315 therein.

Figure 10:
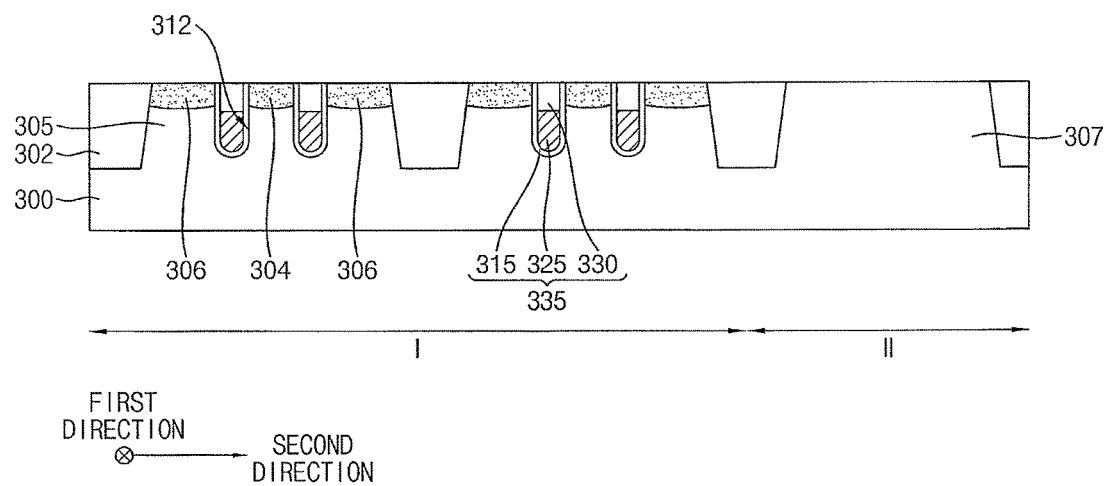

Referring to FIG. 10, a first gate structure 335 may be formed in the gate trench 312, and first and second impurity regions 304 and 306 may be formed at upper portions of the first active patterns 305.

In example embodiments, an upper portion of the first gate electrode layer 320 may be planarized by a CMP process until a top surface of the mask pattern 310 is exposed. Subsequently, an upper portion of the remaining first gate electrode layer 320 may be etched by an etch-back process to form a first gate electrode 325 partially filling the gate trench 312.

A first gate mask layer including, e.g., silicon nitride may be formed on the first gate electrode 325 and the mask pattern 310. The first gate mask layer and the mask pattern 310 may be planarized by a CMP process to form a first gate mask 330 filling a remaining portion of the gate trench 312. As described above, the first gate structure 335 including the first gate insulation pattern 315, the first gate electrode 325, and the first gate mask 330 sequentially formed in the gate trench 312 may be achieved.

The first gate structure 335 may extend in the first direction and may be buried in the isolation layer 302 and the first active patterns 305 according to a shape of the gate trench 312.

A first ion-implantation mask (not illustrated) covering the second region II may be formed, and impurities may be implanted at the upper portions of the first active patterns 305 adjacent to the first gate structures 335 to form the first and second impurity regions 304 and 306. The first ion-implantation mask may be removed by an ashing process and/or a strip process after forming the first and second impurity regions 304 and 306.

After performing the processes as described above, a BCAT structure defined by the first and second impurity regions 304 and 306, and the first gate structure 335 may be formed at the upper portion of the substrate 300.

Figure 11:
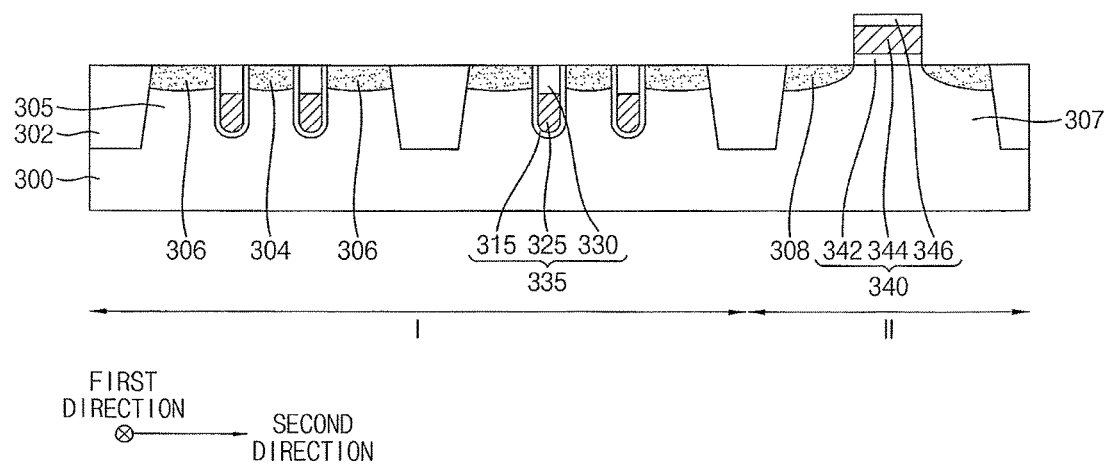

Referring to FIG. 11, a second gate structure 340 and a third impurity region 308 may be formed on the second active pattern 307.

For example, a second gate insulation layer, a second gate electrode layer, and a second gate mask layer may be sequentially formed on the first and second active patterns 305 and 307, and the isolation layer 302. The second gate mask layer may be partially etched to form a second gate mask 346, and the second gate electrode layer and the second gate insulation layer may be patterned utilizing the second gate mask 346. Accordingly, the second gate structure including a second gate insulation pattern 342, a second gate electrode 344 and the second gate mask 346 sequentially stacked from a top surface of the second active pattern 307 may be achieved.

A second ion-implantation mask (not illustrated) covering the first region I may be formed, and impurities may be implanted at an upper portion of the second active pattern 307 adjacent to the second gate structure 340 to form the third impurity region 308.

After performing the processes as described above, a peripheral circuit transistor or a logic transistor including the second gate structure 340 and the third impurity region 308 may be formed on the second active pattern 307.

The second gate insulation layer may be formed by a thermal oxidation process or a radical oxidation process on the active patterns 305 and 307. The second gate insulation layer may include silicon oxide. In an embodiment, the second gate insulation layer may be formed by a deposition process, e.g., a CVD process, and may include silicon oxide or a metal oxide.

The second gate electrode layer may be formed of a metal, a metal nitride, a metal silicide and/or doped polysilicon. The second gate mask layer may be formed of a silicon nitride-based material. The second gate electrode layer and the second gate mask layer may be formed by, e.g., a CVD process, an ALD process, or a PVD process.

In some embodiments, a mask pattern covering the first region I may be formed before forming the second gate insulation layer. In this case, the second gate insulation layer, the second electrode layer, and the second gate mask layer may be formed conformally on surfaces of the mask pattern and the second active pattern 307. The mask pattern may be utilized as the second ion-implantation mask after forming the second gate structure 340. The mask pattern and/or the second ion-implantation mask may be removed by an ashing process and/or a strip process after forming the third impurity region.

Figure 12:
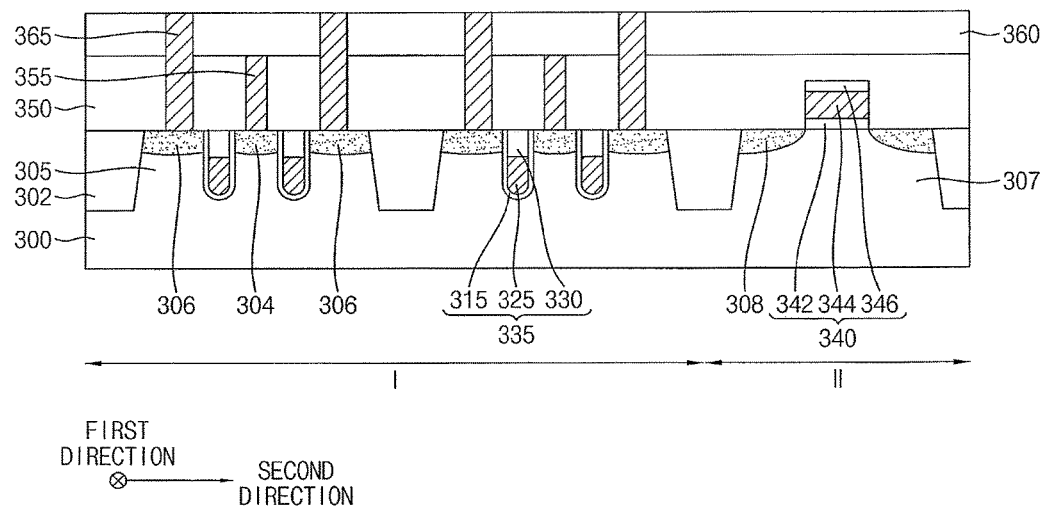

Referring to FIG. 12, a conductive pattern 355 and a first contact 365 electrically connected to the BCAT structure may be formed in the first region I.

For example, a first insulating interlayer 350 covering the BCAT structure may be formed on the first and second active patterns 305 and 307 and the isolation layer 302. The first insulating interlayer 350 may be partially etched to form a first opening through which the first impurity region 304 is exposed. A first conductive layer sufficiently filling the first opening may be formed. An upper portion of the first conductive layer may be planarized by, e.g., a CMP process to form the conductive pattern 355.

In some embodiments, the conductive pattern 355 may extend in the first direction and may be electrically connected to a plurality of the first impurity regions 304. In this case, the conductive pattern 355 may serve as a source line.

A second insulating interlayer 360 covering the conductive pattern 355 may be formed on the first insulating interlayer 350. The second and first insulating interlayers 360 and 350 may be partially etched to form first contact holes, each of which may expose the second impurity region 306. A second conductive layer sufficiently filling the first contact holes may be formed, and an upper portion of the second conductive layer may be planarized by a CMP process to form the first contacts 365.

The first and second insulating interlayers 350 and 360 may be formed of silicon oxide by a CVD process or a spin coating process. The first and second conductive layers may be formed of a metal, a metal nitride, a metal silicide and/or doped polysilicon by a sputtering process, a CVD process or an ALD process.

Figure 13:
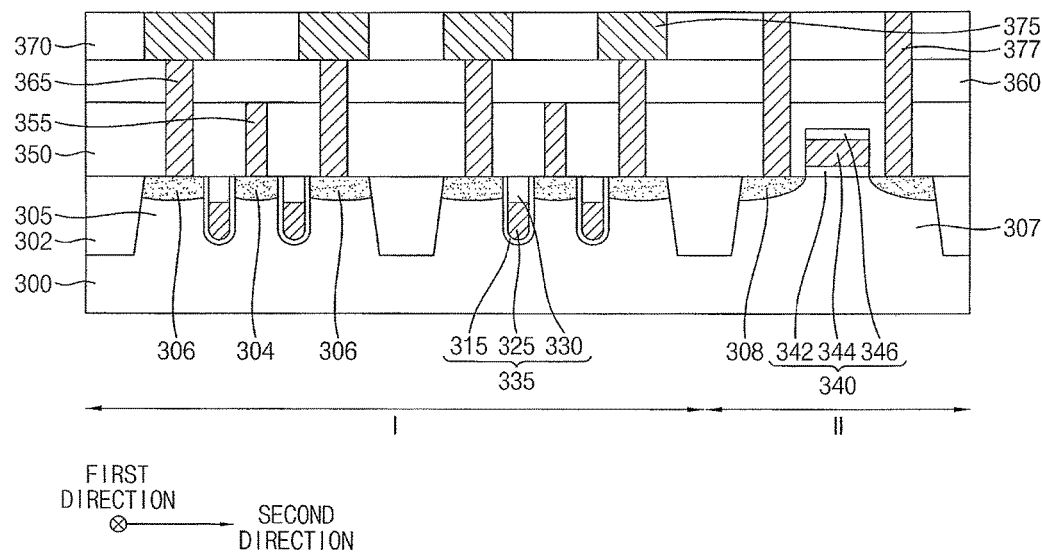

Referring to FIG. 13, a pad 375 that contacts, for example, direct contacts, or is electrically connected to the first contact 365 may be formed.

For example, a third insulating interlayer 370 covering the first contacts 365 may be formed on the second insulating interlayer 360. The third insulating interlayer 370 may be formed of a silicon oxide-based material substantially the same as or similar to that of the first and second insulating interlayers 350 and 360.

The third insulating interlayer 370 may be partially removed to form a second opening through which the first contact 365 is at least partially exposed. As shown in FIG. 13, the first contact 365 may be completely exposed, for example, the pad 375 may be wider than the first contact 365. A third conductive layer may be formed to sufficiently fill the second opening. The third conductive layer may be planarized by a CMP process to form the pad 375.

In some embodiments, the second opening may be formed correspond to each first contact 365. In this case, each pad 375 may be electrically connected to a respective one of the first contact 365. In some embodiments, the second opening may extend in the first direction to expose a plurality of the first contacts 365. In this case, the pad 375 may extend linearly in the first direction.

The third conductive layer may be formed of a metal, a metal nitride, a metal silicide and/or doped polysilicon by a CVD process, a sputtering process, an ALD process, etc. In some embodiments, the third conductive layer may be formed by a plating process, e.g., a copper electroplating process.

In some embodiments, a barrier conductive layer including, e.g., a metal nitride, may be formed on an inner wall of the second opening before forming the third conductive layer.

A second contact 377 electrically connected to the peripheral circuit transistor or the logic transistor formed in the second region II may be formed. For example, the third to first insulating interlayers 370, 360, and 350 may be partially etched to form a third opening through which the third impurity region 308 may be exposed.

A fourth conductive layer sufficiently filling the third opening may be formed, and an upper portion of the fourth conductive layer may be planarized by a CMP process to form the second contact 377. The fourth conductive layer may be formed of a metal, a metal nitride, a metal silicide and/or doped polysilicon by a CVD process, a sputtering process, an ALD process, etc.

Figure 14:
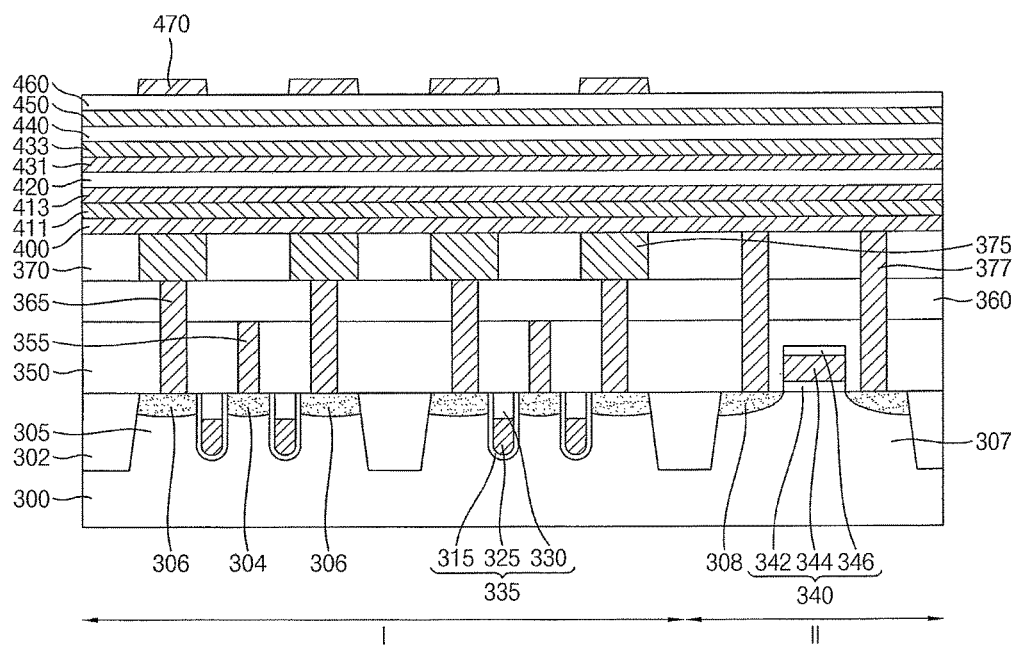

Referring to FIG. 14, a lower electrode layer 400 covering the pads 375 and the second contacts 377 may be formed on the third insulating interlayer 370. The lower electrode layer 400 may be formed of a metal such as Ti, Ta or W, or a nitride of the metal by a sputtering process or an ALD process.

Layers for forming an MTJ structure may be formed on the lower electrode layer 400. In some example embodiments, a first lower pinned layer 411, a second lower pinned layer 413, a spacer layer 420, a first upper pinned layer 431, a second upper pinned layer 433, a tunnel barrier layer 440, a free layer 450, and a capping layer 460 may be sequentially formed on the lower electrode layer 400.

In some embodiments, the layers for forming the MTJ structure may be formed of materials substantially the same as or similar to those described with reference to FIG. 5 by, e.g., a sputtering process.

In some embodiments, the layers may be formed in-situ in a sputtering process chamber by varying metal targets and/or reactive gases according to a material included in each layer.

For example, the first lower pinned layer 411 may be formed by a sputtering process using a Co-target, a Fe-target, a Pt-target, etc., to include a crystalline alloy such as CoPt, FePt, or the like. Accordingly, the first lower pinned layer 411 may have a relatively high Ms and/or a relatively high surface roughness.

A target including an impurity element for an amorphization may be further used to form the second lower pinned layer 413. For example, a CoB target or CoPtB target may be used such that the second lower pinned layer 413 may include an amorphous alloy such as CoPtB, FePtB, or the like. Accordingly, the second lower pinned layer 413 may have a relatively low Ms and/or a relatively low surface roughness.

The first upper pinned layer 431 and the second upper pinned layer 433 may be formed using a material and/or a process condition substantially the same as or similar to the material and/or process condition for forming the second lower pinned layer 413 and the first lower pinned layer 411, respectively.

It is to be understood that in some example embodiments, the layers for forming the MTJ structure may be formed as constructions substantially the same as or similar to those illustrated in any one of FIGS. 1 to 5.

An upper electrode 470 may be formed on the capping layer 460. For example, an upper electrode layer including a metal, a metal nitride or a metal silicide may be formed on the capping layer 460, and may be patterned to form a plurality of the upper electrodes 470, each of which may be superimposed over the pad 375.

Figure 15:
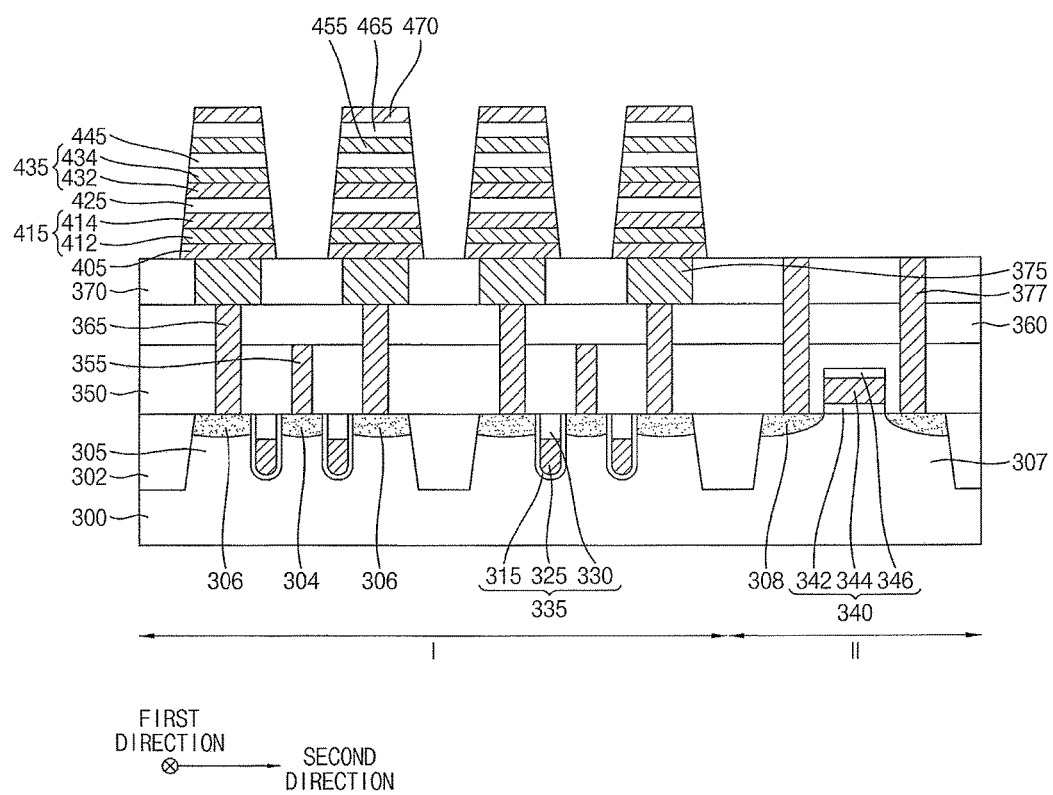

Referring to FIG. 15, the layers for forming the MTJ structure, and the lower electrode layer 400 may be sequentially patterned by a dry etching process using the upper electrode 470 as a mask. Accordingly, a magnetic memory element including a lower electrode 405, the MTJ structure, and the upper electrode 470 may be formed on the pad 375.

The MTJ structure may include a lower pinned layer pattern 415, a spacer 425, an upper pinned layer pattern 435, a tunnel barrier pattern 445, a free layer pattern 455 and a capping pattern 465 which may be sequentially stacked from a top surface of the lower electrode 405.

The lower pinned layer pattern 415 may include a first lower pinned layer pattern 412 and a second lower pinned layer pattern 414. The upper pinned layer pattern 435 may include a first upper pinned layer pattern 432 and a second upper pinned layer pattern 434.

In some embodiments, the magnetic memory element may have a stack structure substantially the same as or similar to that illustrated in FIG. 6.

Figure 16:
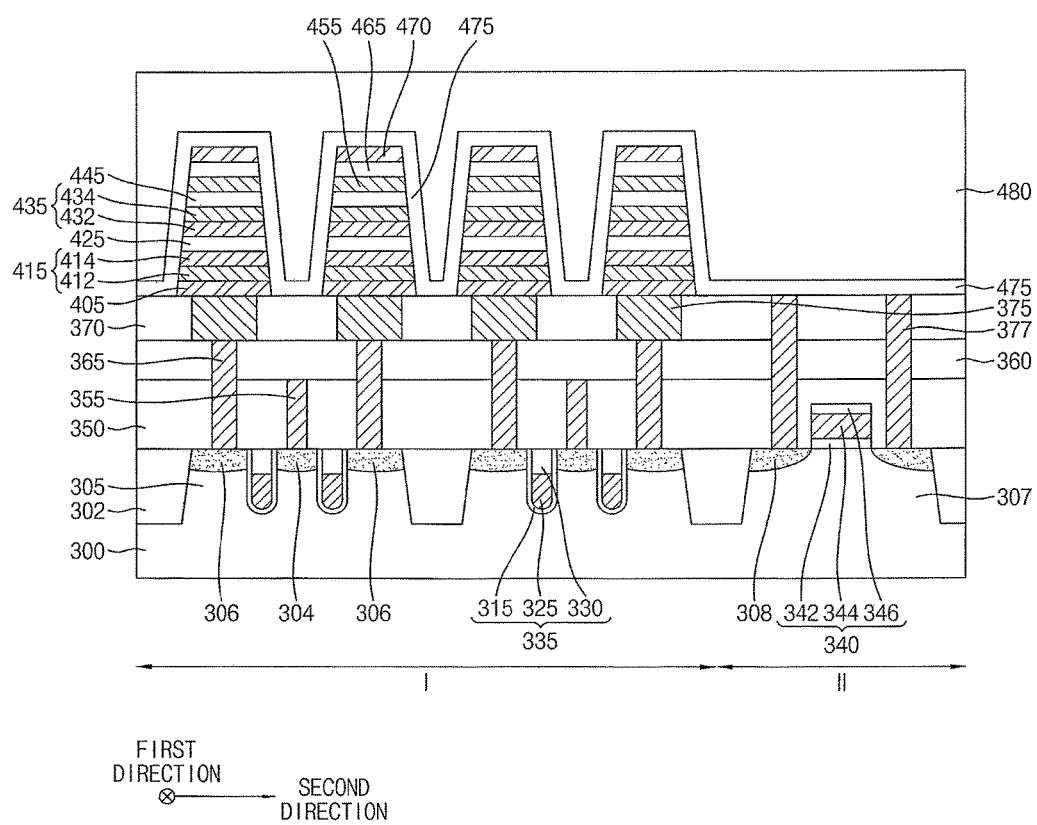

Referring to FIG. 16, a passivation layer 475 may be formed along a top surface of the third insulating interlayer 370 and surfaces of the magnetic memory elements. For example, the passivation layer 475 may be formed of silicon nitride or silicon oxynitride by an ALD process.

An upper insulation layer 480 covering the magnetic memory elements may be formed on the passivation layer 475. The upper insulation layer 480 may be formed of a silicon oxide-based material that is substantially the same as or similar to that of the first to third insulating interlayers 350, 360, and 370 by a CVD process or a spin coating process.

Figure 17:
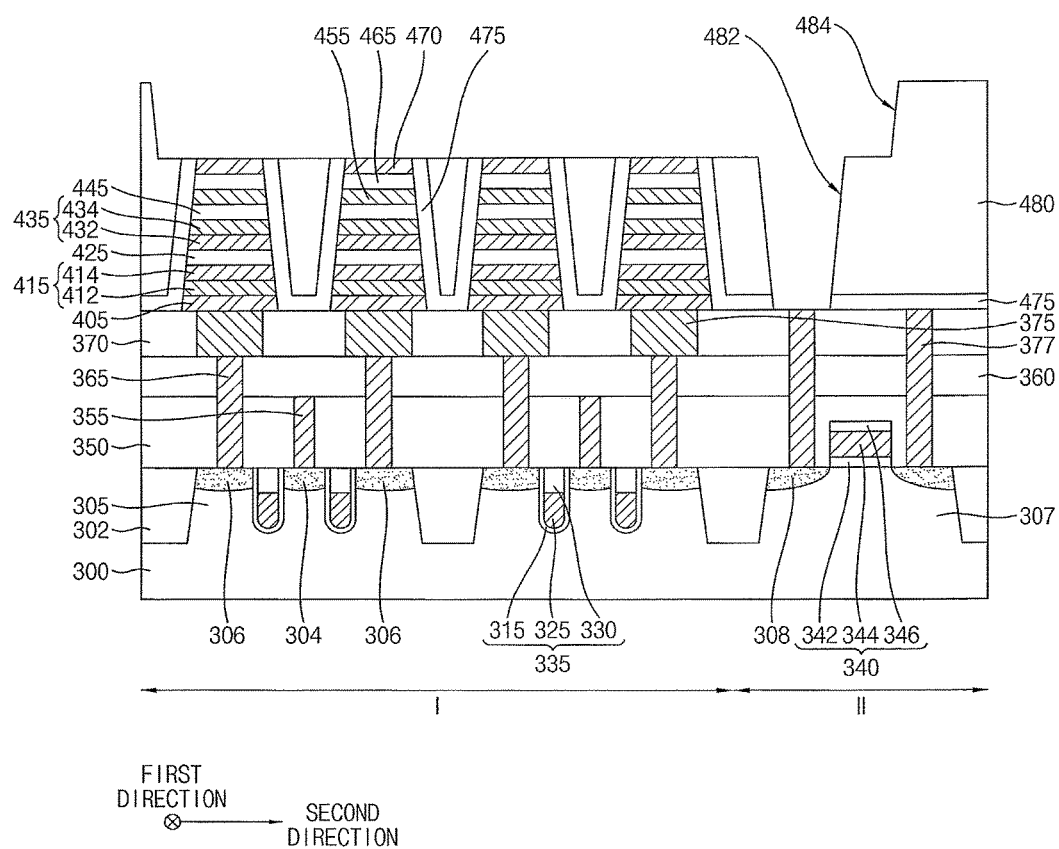

Referring to FIG. 17, a via hole 482 may be formed by etching portions of the upper insulation layer 480 and the passivation layer 475 formed in the second region II. In example embodiments, a top surface of the second contact 377 may be at least partially exposed through the via hole 482.

Subsequently, an upper portion of the upper insulation layer 480 and an upper portion of the passivation layer 475 in the first region I may be partially removed to form a trench 484 connected to the via hole 482. Top surfaces of the upper electrodes 470 may be exposed by a bottom of the trench 484, e.g., all upper electrodes 470 may be completely exposed.

Figure 18:
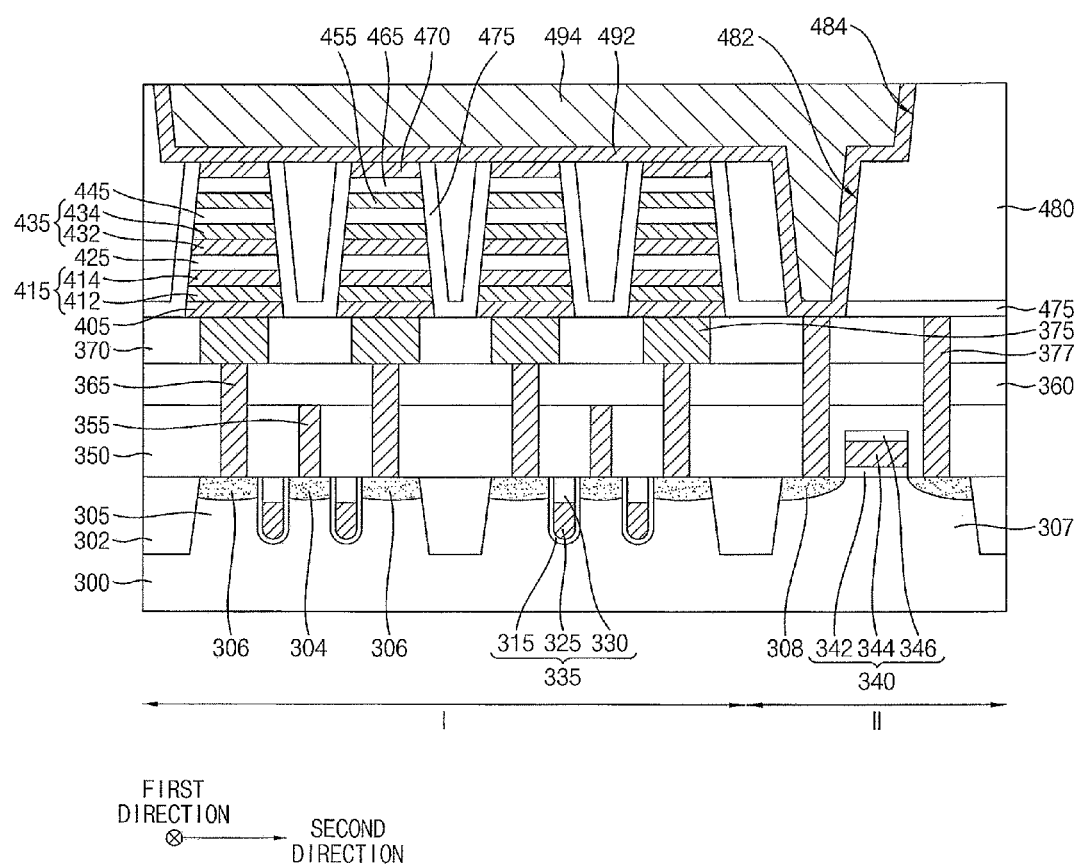

Referring to FIG. 18, a conductive line filling the via hole 482 and the trench 484 may be formed.

In example embodiments, a barrier layer may be formed conformally along inner walls of the via hole 482 and the trench 484, and a metal filling layer sufficiently filling the via hole 482 and the trench 484 may be formed on the barrier layer. Upper portions of the barrier layer and the metal filling layer may be planarized by a CMP process to form the conductive line including a barrier pattern 492 and the metal filling pattern 494.

In some embodiments, the barrier layer may be formed of a metal such as Ti, Ta, Ru, etc., or a nitride of the metal by a sputtering process or a CVD process. The metal filling layer may be formed by a plating process, e.g., a copper electroplating process. For example, a copper seed layer may be formed on the barrier later, and the metal filling layer may be formed by the copper electroplating process.

A portion of the conductive line formed in the trench 484 may extend in the second direction and may serve as, e.g., a bit line of the magnetic memory device. A portion of the conductive line formed in the via hole 482 may be electrically connected to the second contact 377 and may serve as a via structure transferring an electrical signal from the peripheral circuit transistor or the logic transistor.

Figure 19:
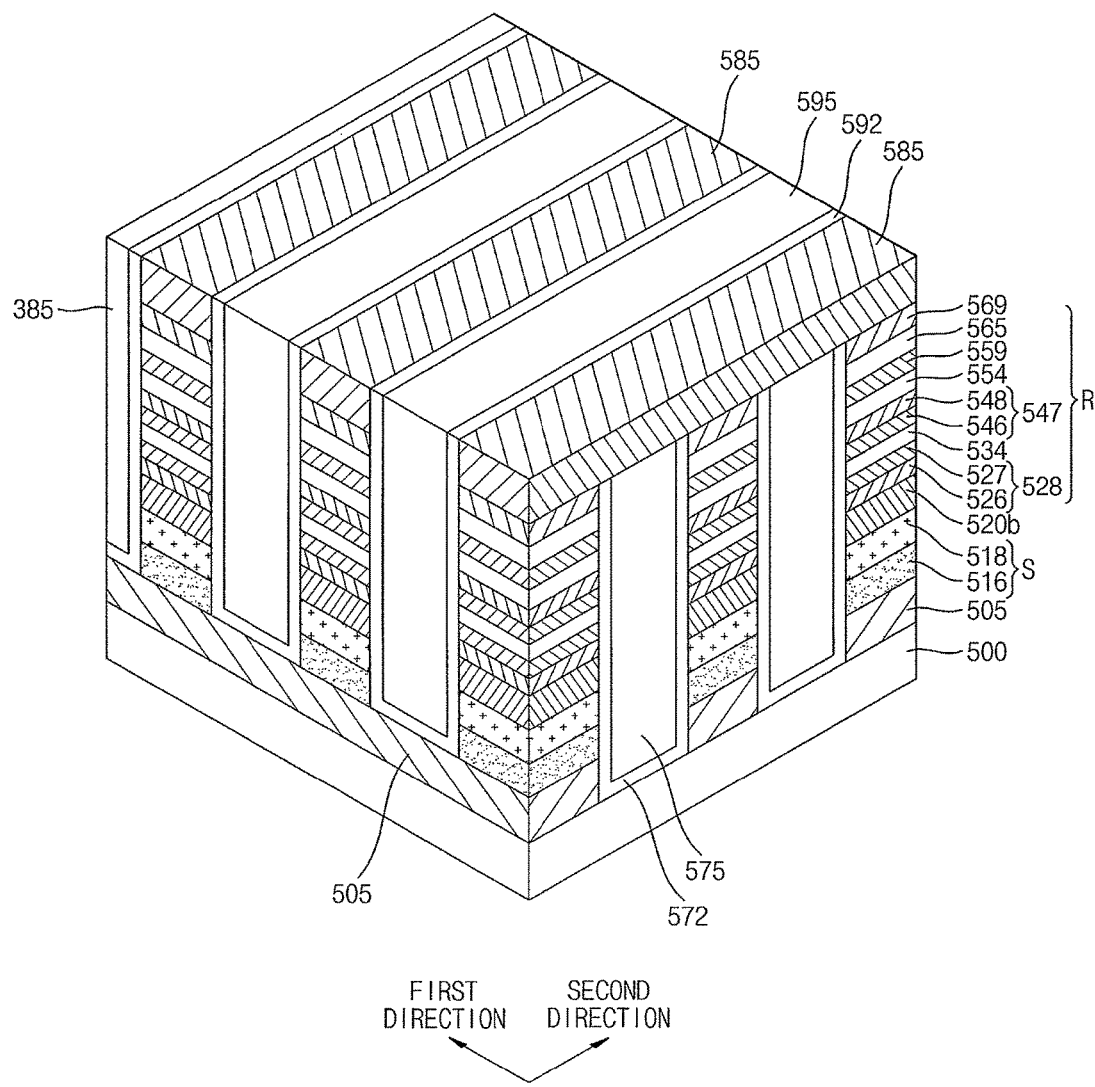
FIG. 19 illustrates a perspective view of a magnetic memory device in accordance with example embodiments.

FIG. 19 illustrates a perspective view of a magnetic memory device in accordance with example embodiments. For example, FIG. 19 illustrates a magnetic memory device having a cross-point array structure in which a memory cell is defined at an intersection area of conductive lines.

Two directions that are parallel to a top surface of a base insulation layer 500 and that cross each other are defined as a first direction and a second direction in FIG. 19. For example, the first and second directions may be orthogonal to each other. The definitions of the directions are substantially the same throughout FIGS. 20 to 26.

Referring to FIG. 19, the magnetic memory device may include a first conductive line 505 and a second conductive line 585 that cross each other. The magnetic memory device may include a lower electrode 520b, an MTJ structure and an upper electrode 569 between the first conductive line 505 and the second conductive line 585.

The first conductive line 505 may be disposed on the base insulation layer 500 and may extend in, e.g., the first direction. A plurality of the first conductive lines 505 may be arranged along the second direction.

The base insulation layer 500 may include silicon oxide, silicon nitride, or silicon oxynitride. The base insulation layer 500 may cover a lower structure such as a transistor formed on a semiconductor substrate.

The second conductive line 585 may be disposed over the first conductive line 505, and may extend in the second direction. A plurality of the second conductive lines 585 may be arranged along the first direction.

The first and second conductive lines 505 and 585 may include a metal such as W, Cu, Al, Ti or Ta, or a nitride of the metal. In example embodiments, the first conductive line 505 may serve as a word line of the magnetic memory device. The second conductive line 585 may serve as a bit line of the magnetic memory device.

A memory cell may be disposed at an intersection area of the first conductive line 505 and the second conductive line 585. In example embodiments, a plurality of the memory cells may be arranged along the first direction and the second direction to form a cross-point array.

The memory cell may include the lower electrode 520*b* and the upper electrode 569 at each intersection area, and may include the MTJ structure between the lower and upper electrodes 520*b* and 569.

The MTJ structure may have elements and/or constructions substantially the same as or similar to those of the MTJ structure illustrated in FIG. 6 or FIG. 7. In some embodiments, the MTJ structure may include a lower pinned layer pattern 528, a spacer 534, an upper pinned layer pattern 547, a tunnel barrier pattern 554, a free layer pattern 559 and a capping pattern 565 sequentially stacked from the lower electrode 520*b*.

The lower pinned layer pattern 528 may include a first lower pinned layer pattern 526 and a second lower pinned layer pattern 527, and the upper pinned layer pattern 547 may include a first upper pinned layer pattern 546 and a second upper pinned layer pattern 548.

The MTJ structure may include a stack structure substantially the same as that described with reference to FIG. 5. It is to be understood that in some embodiments, the MTJ structure may include a stack structure substantially the same as or similar to those described with reference to FIGS. 1 to 4.

In some example embodiments, a selection element S may be disposed between the lower electrode 520*b* and the first conductive line 505. For example, the selection element S may include a semiconductor diode. The semiconductor diode may include a first semiconductor pattern 516 and a second semiconductor pattern 518 which may include different impurities.

Accordingly, the memory cell may have a "1S+1R" structure including the selection element S and a resistance element R provided as a magnetic memory element.

A first passivation pattern 572 may be formed along sidewalls of the memory cells neighboring in the second direction and a top surface of the base insulation layer 500. A first insulation pattern 575 may be formed on the first passivation pattern 572. The first insulation pattern 575 may extend in the first direction between the memory cells neighboring in the second direction.

A second passivation pattern 592 may be formed along sidewalls of the memory cells neighboring in the first direction and a top surface of the first conductive line 505. A second insulation pattern 595 may be formed on the second passivation pattern 592. The second insulation pattern 595 may extend in the second direction between the memory cells neighboring in the first direction.

The first and second passivation patterns 572 and 592 may include silicon nitride or silicon oxynitride. The first and second insulation patterns 575 and 595 may include, e.g., silicon oxide.

Figure 22:
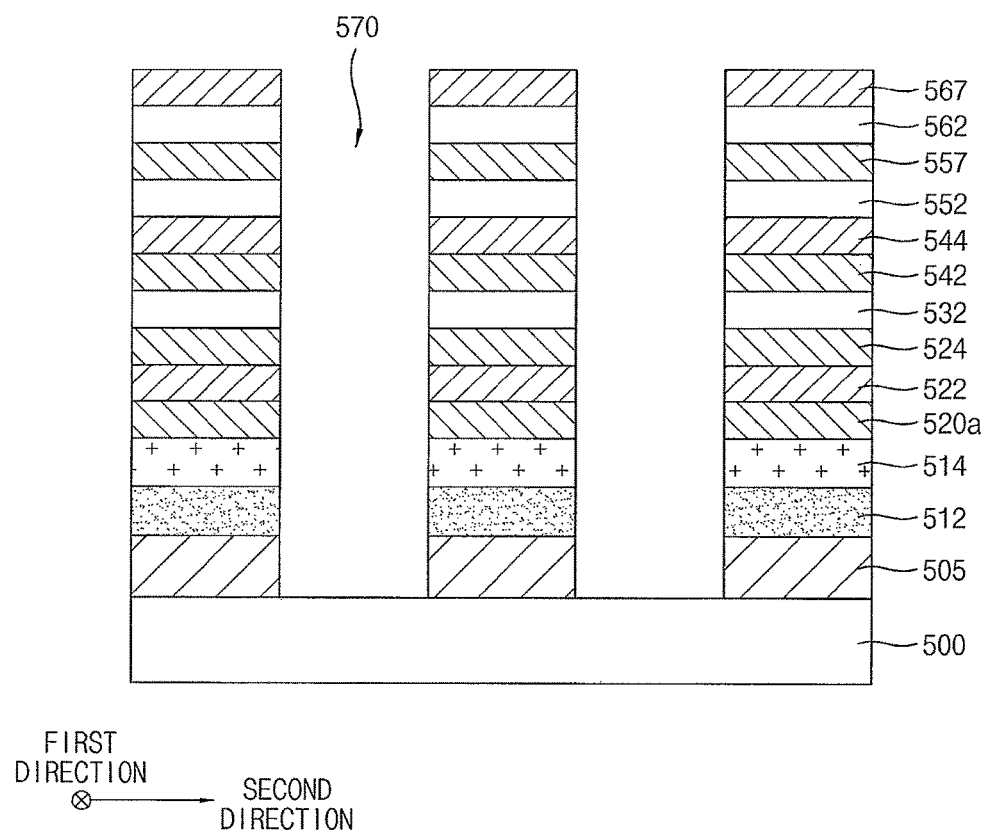
Figure 23:
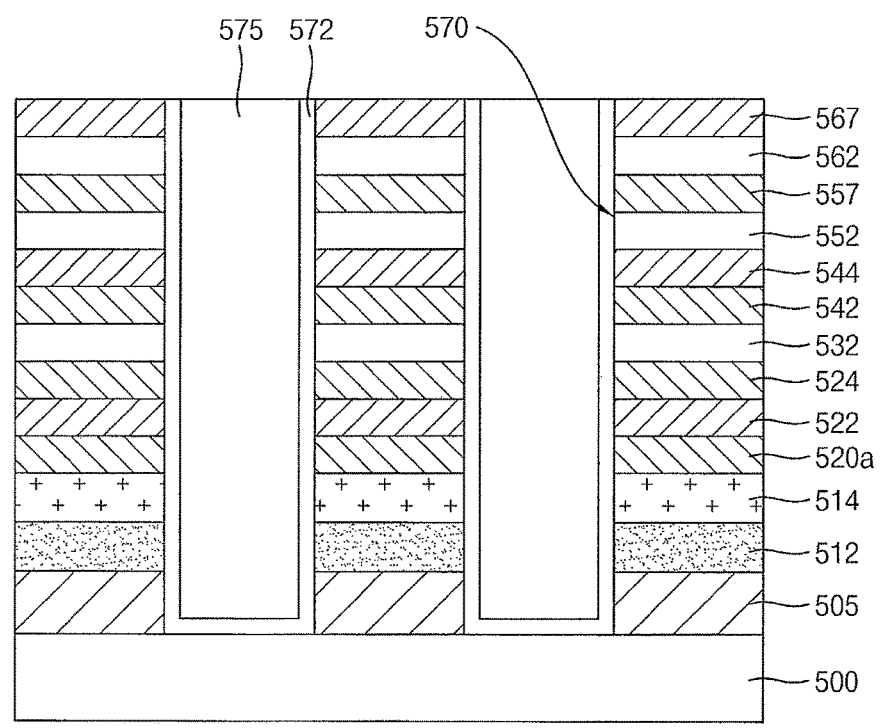
Figure 24:
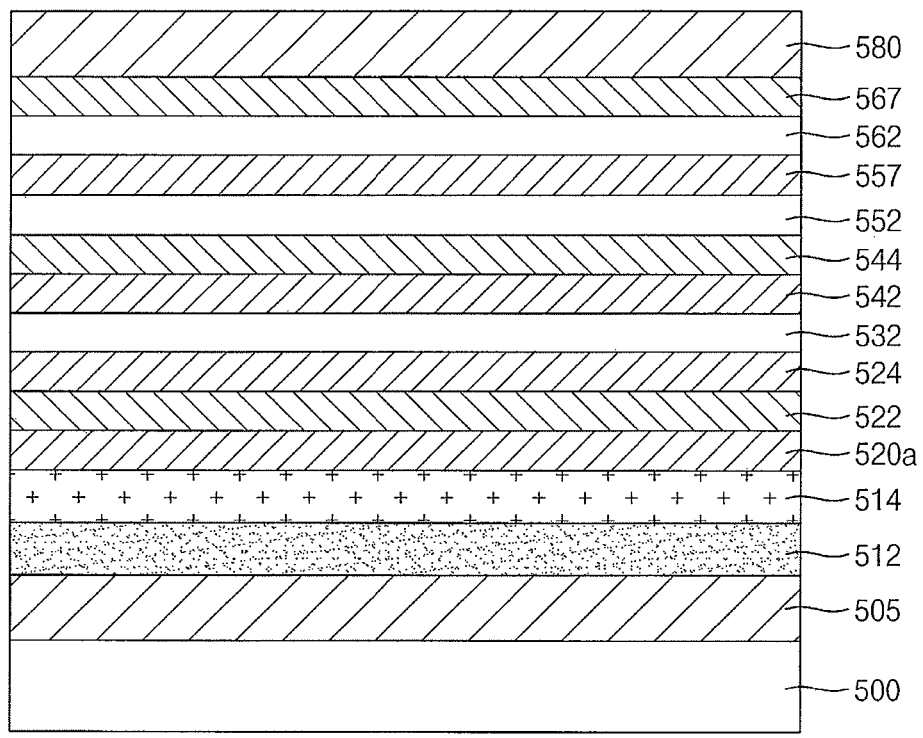
Figure 25:
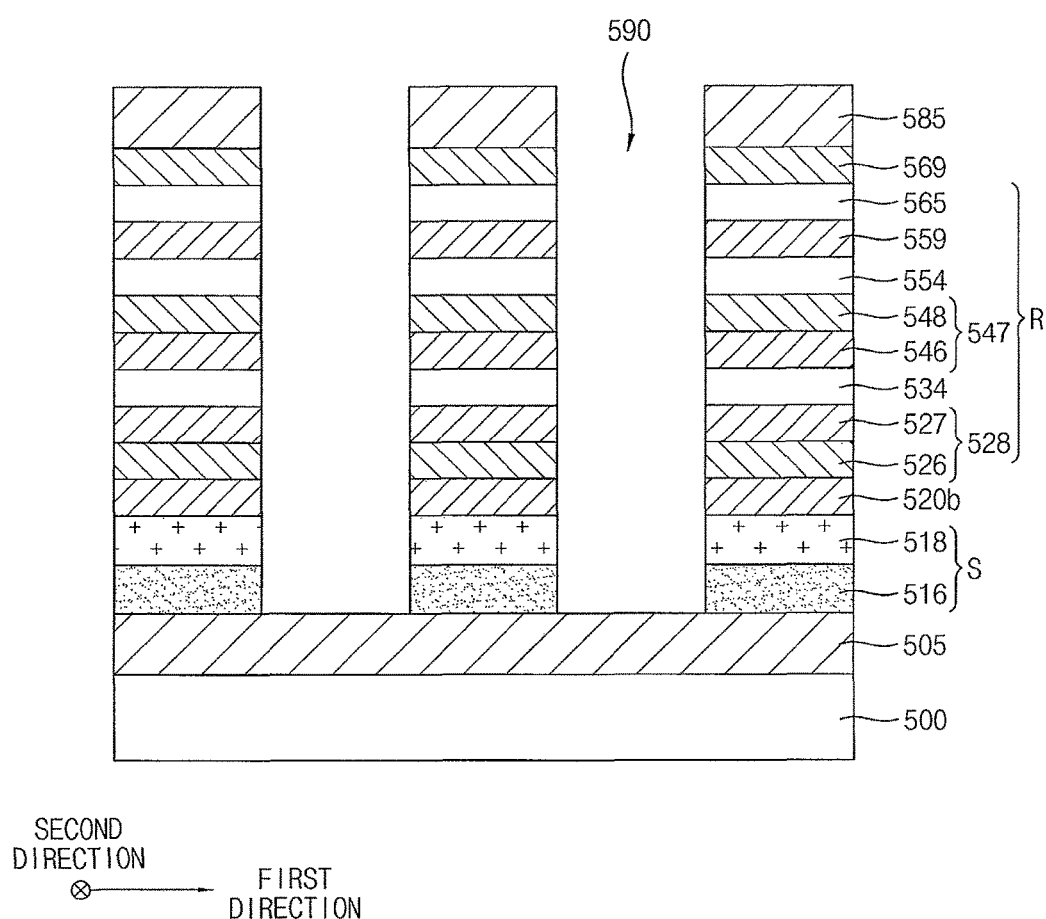
Figure 26:
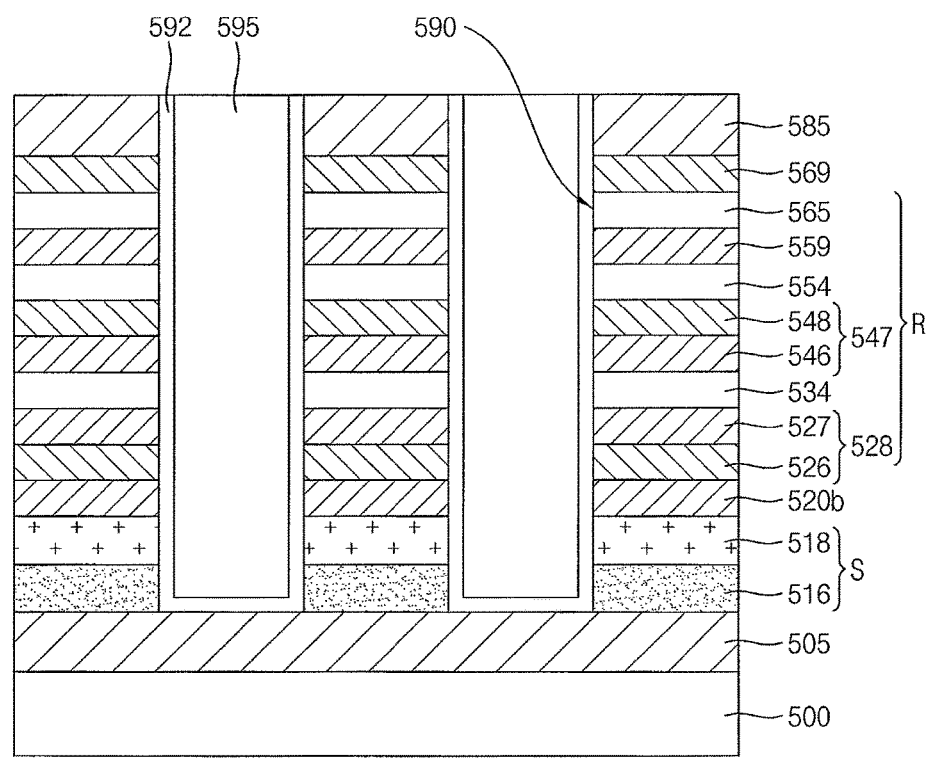

FIGS. 20 to 26 illustrate cross-sectional views of stages of a method of manufacturing a magnetic memory device in accordance with example embodiments. For example, FIGS. 20 to 23 illustrate cross-sectional views taken along the second direction. FIGS. 24 to 26 illustrate cross-sectional views taken along the first direction.

Figure 20:
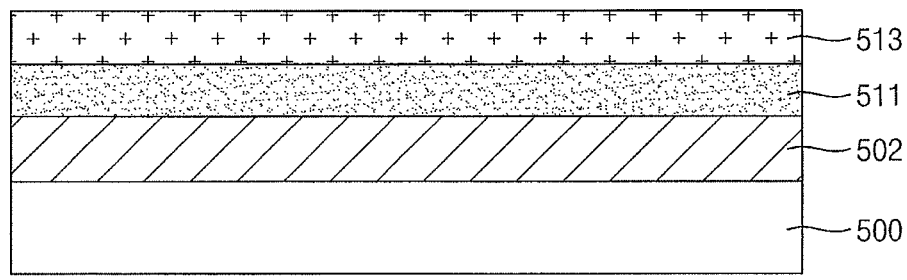
FIGS. 20 to 26 illustrate cross-sectional views of stages in a method of manufacturing a magnetic memory device in accordance with example embodiments.

Referring to FIG. 20, a first conductive layer 502, a first semiconductor layer 511 and a second semiconductor layer 513 may be sequentially formed on a base insulation layer 500.

The base insulation layer 500 may include silicon oxide, silicon nitride or silicon oxynitride. For example, an insulation material may be deposited on a semiconductor substrate to form the base insulation layer 500 to cover a lower structure such as a transistor formed on the semiconductor substrate.

The first conductive layer 502 may be formed on the base insulation layer 500. The first conductive layer 502 may be formed of a metal or a metal nitride by, e.g., a sputtering process or an ALD process.

A semiconductor layer including, e.g., polysilicon may be formed on the first conductive layer 502, and n-type impurities and p-type impurities may be sequentially implanted to form the first semiconductor layer 511 and the second semiconductor layer 513. Projection or implantation depths of the n-type and p-type impurities may be controlled such that the semiconductor layer may be divided into the first semiconductor layer 511 and the second semiconductor layer 513.

Figure 21:
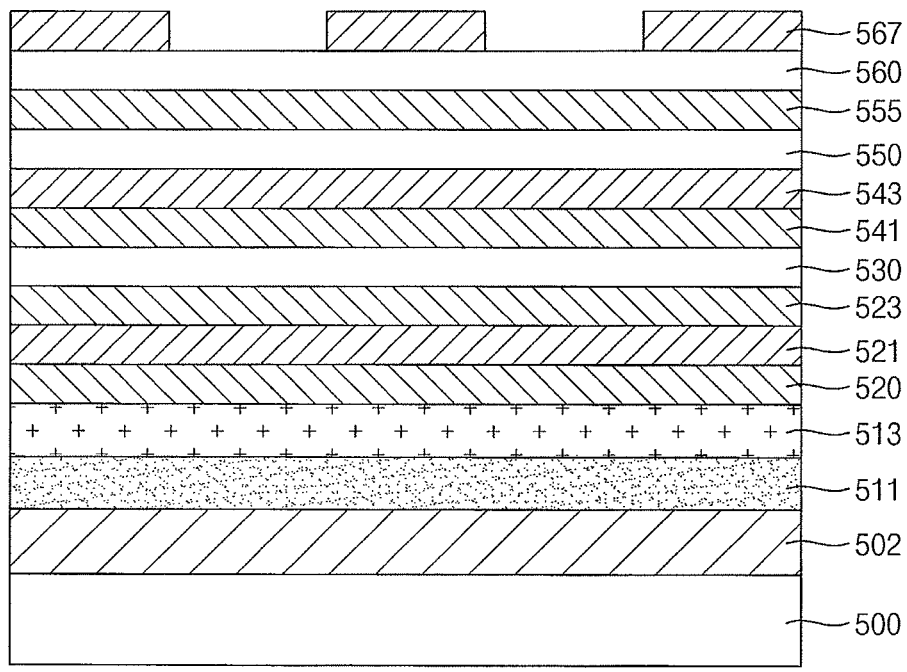

Referring to FIG. 21, a lower electrode layer 520, a first lower pinned layer 521, a second lower pinned layer 523, a spacer layer 530, a first upper pinned layer 541, a second upper pinned layer 543, a tunnel barrier layer 550, a free layer 555 and a capping layer 560 may be sequentially formed on the second semiconductor layer 513. A plurality of upper electrode layer patterns 567 extending in the first direction may be formed on the capping layer 560.

In some example embodiments, the lower electrode layer 520 through the upper electrode layer patterns 567 may be formed from materials and processes substantially the same as or similar to those described with reference to FIG. 14. The first lower pinned layer 521 through the capping layer 560 may be formed as a stack structure substantially the same as or similar to the stack structure described with reference to FIG. 5.

For example, the first lower pinned layer 521 may be formed by a sputtering process using a Co-target, a Fe-target, a Pt-target, etc., to include a crystalline alloy such as CoPt, FePt, or the like. Accordingly, the first lower pinned layer 521 may have a relatively high Ms and/or a relatively high surface roughness.

A target including an impurity element for amorphorization may be further used to form the second lower pinned layer 523. For example, a CoB target or CoPtB target may be used such that the second lower pinned layer 523 includes an amorphous alloy such as CoPtB, FePtB, or the like. Accordingly, the second lower pinned layer 523 may have a relatively low Ms and/or a relatively low surface roughness.

The first upper pinned layer 541 and the second upper pinned layer 543 may be formed from processes and/or materials substantially the same as or similar to those of the second lower pinned layer 523 and the first lower pinned layer 521, respectively.

It is to be understood that in some embodiments, layers for forming an MTJ structure may be formed on the lower electrode layer 520 as a stack structure substantially the same as or similar to that described with reference to any one of FIGS. 1 to 4.

Referring to FIG. 22, the capping layer 560 through the first conductive layer 502 may be sequentially etched by, e.g., a dry etching process using the upper electrode layer pattern 567 as a mask to form a first opening 570. The first opening 570 may extend in the first direction, and a plurality of the first openings 570 may be formed along the second direction. A top surface of the base insulation layer 500 may be exposed through the first opening 570.

After the formation of the first opening 570, a stack structure including a first conductive line 505, a first semiconductor layer line 512, a second semiconductor layer line 514, a lower electrode layer pattern 520a, a first lower pinned layer line 522, a second lower pinned layer line 524, a spacer line 532, a first upper pinned layer line 542, a second upper pinned layer line 544, a tunnel barrier line 552, a free layer line 557, a capping line 562, and the upper electrode layer pattern 567 may be sequentially formed from the base insulation layer 500. The stack structure may extend in the first direction, and a plurality of the stack structures may be formed along the second direction.

Referring to FIG. 23, a passivation pattern 572 may be formed along a sidewall and a bottom of the first opening 570, and a first insulation pattern 575 filling the first opening 570 may be formed on the first passivation pattern 572.

In example embodiments, a first passivation layer may be formed along surfaces of the stack structures and the exposed top surface of the base insulation layer 500. A first insulation layer sufficiently filling the first openings 570 may be formed on the first passivation layer. Upper portions of the first insulation layer and the first passivation layer may be planarized by a CMP process to form the first passivation pattern 572 and the first insulation pattern 575.

The first passivation layer may be formed of, for example, silicon nitride or silicon oxynitride by a CVD process. The first insulation layer may be formed of silicon oxide by an ALD process or a CVD process.

Referring to FIG. 24, a second conductive layer 580 may be formed on the upper electrode layer pattern 567, the first passivation pattern 572, and the first insulation pattern 575.

The second conductive layer 580 may be formed from a process and/or a material substantially the same as or similar to the process or material used for the first conductive layer 502.

Referring to FIG. 25, the second conductive layer 580 may be partially etched to form a second conductive line 585 extending in the second direction. A plurality of the second conductive lines 585 may be formed along the first direction.

The upper electrode layer pattern 567 through the first semiconductor layer line 512 may be sequentially etched using the second conductive lines 585 substantially as an etching mask. Accordingly, a second opening 590 may be formed, and the stack structures may be additionally etched along the second direction to form a memory cell at each intersection area of the first and second conductive lines 505 and 585.

The second opening 590 may extend in the second direction, and may cross the first opening 570. Sidewalls of the memory cells neighboring in the first direction may be exposed through the second opening 590. The first passivation pattern 572 and the first insulation pattern 575 may be cut by the second opening 590. A top surface of the first conductive line 505 may be exposed through the second opening 590.

In example embodiments, the memory cell may include a selection element S, a lower electrode 520b, a resistance element R serving as the MTJ structure and an upper electrode 569.

The selection element S may include a first semiconductor pattern 516 and a second semiconductor pattern 518, and may serve as a diode. The MTJ structure may include a lower pinned layer pattern 528, a spacer 534, an upper pinned layer pattern 547, a tunnel barrier pattern 554, a free layer pattern 559, and a capping pattern 565.

The lower pinned layer pattern 528 may include a first lower pinned layer pattern 526 and a second lower pinned layer pattern 527, and the upper pinned layer pattern 547 may include a first upper pinned layer pattern 546 and a second upper pinned layer pattern 548.

Referring to FIG. 26, a second passivation pattern 592 may be formed along a sidewall and a bottom of the second opening 590, and a second insulation pattern 595 filling the second opening 590 may be formed on the second passivation pattern 592.

The second passivation pattern 592 and the second insulation pattern 595 may be formed from processes and/or materials substantially the same as or similar to those for forming the first passivation pattern 572 and the first insulation pattern 575 as illustrated in FIG. 23.

A sidewall of the memory cell formed at each intersection area may be covered by the first and second passivation patterns 572 and 592, and the memory cells neighboring each other may be insulated from each other by the first and second insulation patterns 575 and 595.

According to example embodiments as described above, at least one crystalline (or high Ms) pinned layer and at least one amorphous (or low Ms) pinned layer may be included in a pinned layer structure. Thus, a Hex in an MTJ structure may be increased without degrading TMR properties while achieving a desired magnitude of a magnetic vector and/or a spin polarization. A conversion margin of a magnetization direction in a magnetic memory element may be increased such that an operational reliability in, e.g., a cross-point magnetic memory cell array may be improved.

By way of summation and review, an MTJ structure may include a free layer and a fixed, e.g., pinned, layer. An operational reliability of the MRAM device may be enhanced by improving magnetization properties of the free layer and the pinned layer.

An MTJ structure of an MRAM device may include a stacked structure of a fixed layer/an insulation layer/a free layer. In a vertical MTJ structure, a magnetic material of the fixed layer may include, e.g., an alloy of Co or Fe (e.g., CoPt, FePt, FePd, CoPd, etc.). A high exchange field (Hex) may provide an improved operational reliability of the MRAM device. However, the alloy may have a crystalline structure, and may have a high saturation magnetization (Ms), and a high surface roughness. Accordingly, TMR and Hex properties may be degraded.

According to example embodiments of the present invention, a pinned layer may include an upper pinned layer and a lower pinned layer facing each other with respect to a non-magnetic spacer. At least one of the upper pinned layer or the lower pinned layer may include a magnetic material that may be amorphous and may have a relatively low Ms. For example, the low Ms magnetic material may include a boron-doped alloy, e.g., CoPtB. Boron may be inserted into an alloy structure so that a crystalline structure may be transformed into an amorphous structure, and a crystal growth may be suppressed to result in a low surface roughness. Thus, the pinned layer having the low Ms and surface roughness may be formed, and Hex may be increased.

For example, each of the upper pinned layer and the lower pinned layer may include a crystalline fixed layer and an amorphous fixed layer. The amorphous pinned layers of the low MS may be in contact with a top surface and a bottom surface of an anti-ferromagnetic spacer.

Accordingly, embodiments provide a magnetic memory device having improved magnetization properties. Embodiments provide a method of manufacturing a magnetic memory device having improved magnetization properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof the present invention as set forth in the following claims.

What is claimed is:

1. A magnetic memory device, comprising:
   a substrate;
   a circuit device on the substrate;
   a lower electrode electrically connected to the circuit device;
   a magnetic tunnel junction structure (MTJ structure) on the lower electrode, the MTJ structure including:
      a pinned layer structure including at least one crystalline ferromagnetic layer and at least one amorphous ferromagnetic layer, wherein a surface roughness of the amorphous ferromagnetic layer is less than that of the crystalline ferromagnetic layer;
      a free layer; and
      a tunnel barrier layer between the pinned layer structure and the free layer; and
   an upper electrode on the MTJ structure.

2. The magnetic memory device as claimed in claim 1, wherein:
   the crystalline ferromagnetic layer includes a ferromagnetic metal or an alloy of ferromagnetic metals, the crystalline ferromagnetic layer being substantially devoid of a non-magnetic element, and
   the amorphous ferromagnetic layer includes a ferromagnetic metal alloy doped with a non-magnetic element.

3. The magnetic memory device as claimed in claim 2, wherein the non-magnetic element included in the ferromagnetic metal alloy of the amorphous ferromagnetic layer is at least one of boron (B), carbon (C), nitrogen (N), oxygen (O), fluorine (F), chlorine (Cl), sulfur (S), aluminum (Al), tantalum (Ta), or tungsten (W).

4. The magnetic memory device as claimed in claim 3, wherein:
   the crystalline ferromagnetic layer includes a cobalt-platinum alloy (CoPt) or an iron-platinum alloy (FePt), and
   the amorphous ferromagnetic alloy includes CoPtB or FePtB.

5. The magnetic memory device as claimed in claim 1, wherein a saturation magnetization (Ms) of the amorphous ferromagnetic layer is less than that of the crystalline ferromagnetic layer.

6. The magnetic memory device as claimed in claim 5, wherein:
   the Ms of the amorphous ferromagnetic layer is in a range from about 150 emu/cc to about 800 emu/cc, and
   the Ms of the crystalline ferromagnetic layer is in a range from about 1,000 emu/cc to about 2,000 emu/cc.

7. The magnetic memory device as claimed in claim 1, wherein the pinned layer structure further includes an anti-ferromagnetic spacer between the crystalline ferromagnetic layer and the amorphous ferromagnetic layer.

8. The magnetic memory device as claimed in claim 7, wherein:
   the crystalline ferromagnetic layer has a body-centered cubic (bcc) structure or a face-centered cubic (fcc) structure, and
   the anti-ferromagnetic spacer has a hexagonal close packing (hcp) structure.

9. The magnetic memory device as claimed in claim 1, wherein:
   the pinned layer structure includes a lower pinned layer, an anti-ferromagnetic spacer and an upper pinned layer, which are sequentially stacked, and
   the crystalline ferromagnetic layer is included in each of the lower pinned layer and the upper pinned layer.

10. The magnetic memory device as claimed in claim 9, wherein the amorphous ferromagnetic layer is included in at least one of the lower pinned layer and the upper pinned layer.

11. The magnetic memory device as claimed in claim 10, wherein:
   the amorphous ferromagnetic layer is included in each of the lower pinned layer and the upper pinned layer, and
   the amorphous ferromagnetic layer in the upper pinned layer contacts a top surface of the anti-ferromagnetic spacer, and the amorphous ferromagnetic layer in the lower pinned layer contacts a bottom surface of the anti-ferromagnetic spacer.

12. The magnetic memory device as claimed in claim 11, wherein the crystalline ferromagnetic layer in the upper pinned layer contacts the free layer and the crystalline ferromagnetic layer in the lower pinned layer contacts the lower electrode.

13. A magnetic memory device, comprising:
   a substrate;
   a circuit device on the substrate;
   a lower electrode electrically connected to the circuit device;
   a magnetic tunnel junction structure (MTJ structure) on the lower electrode, the MTJ structure including:
      a pinned layer structure including a plurality of pinned layers that have different saturation magnetizations (Ms) and surface roughnesses;
      a free layer; and
      a tunnel barrier layer between the pinned layer structure and the free layer; and
   an upper electrode on the MTJ structure.

14. The magnetic memory device as claimed in claim 13, wherein the pinned layer structure includes:
   a crystalline ferromagnetic layer; and
   an amorphous ferromagnetic layer having an Ms and a surface roughness less than an Ms and a surface roughness of the crystalline ferromagnetic layer.

15. The magnetic memory device as claimed in claim 14, wherein:
   the Ms of the amorphous ferromagnetic layer is in a range from about 150 emu/cc to about 800 emu/cc, and
   the Ms of the crystalline ferromagnetic layer is in a range from about 1,000 emu/cc to about 2,000 emu/cc.

16. The magnetic memory device as claimed in claim 14, wherein:
   the pinned layer structure includes a lower pinned layer, an upper pinned layer and an anti-ferromagnetic spacer separating the lower pinned layer and the upper pinned layer, and at least one of the upper pinned layer or the lower pinned layer includes a stack structure of the crystalline ferromagnetic layer and the amorphous ferromagnetic layer.

17. The magnetic memory device as claimed in claim 16, wherein the amorphous ferromagnetic layer directly contacts the anti-ferromagnetic spacer.

18. A magnetic memory device, comprising:
a plurality of first conductive lines extending in a first direction;
a plurality of second conductive lines located over the first conductive lines, the second conductive lines extending in a second direction crossing the first direction; and
magnetic tunnel junction (MTJ) structures interposed between the first conductive lines and the second conductive lines, each MTJ structure including:
   a pinned layer pattern including at least one crystalline ferromagnetic pattern and at least one amorphous ferromagnetic pattern, wherein a saturation magnetization (Ms) and a surface roughness of the amorphous ferromagnetic pattern are less than an Ms and a surface roughness of the crystalline ferromagnetic pattern;
   a free layer pattern; and
   a tunnel barrier pattern between the pinned layer pattern and the free layer pattern.

* * * * *